US012641710B2

(12) United States Patent
Wang et al.

(10) Patent No.: US 12,641,710 B2
(45) Date of Patent: May 26, 2026

(54) ELECTRONIC DEVICE

(71) Applicant: Advanced Semiconductor Engineering, Inc., Kaohsiung (TW)

(72) Inventors: Meng-Jen Wang, Kaohsiung (TW); Chien-Yuan Tseng, Kaohsiung (TW); Zhong Kai Chang, Kaohsiung (TW); Shao-Chang Lee, Kaohsiung (TW); Shih-Wei Tien, Kaohsiung (TW); Jyun-Jhih Yang, Kaohsiung (TW); You-Chi Wang, Kaohsiung (TW); Dian-Yong Li, Kaohsiung (TW); Yi Min Lin, Kaohsiung (TW); Jung-Liang Yeh, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 238 days.

(21) Appl. No.: 18/510,535

(22) Filed: Nov. 15, 2023

(65) Prior Publication Data

US 2025/0159793 A1    May 15, 2025

(51) Int. Cl.
*H05K 1/02*        (2006.01)
(52) U.S. Cl.
CPC ... *H05K 1/0218* (2013.01); *H05K 2201/0183* (2013.01); *H05K 2201/0707* (2013.01); *H05K 2201/095* (2013.01); *H05K 2201/09754* (2013.01); *H05K 2201/10931* (2013.01)

(58) Field of Classification Search
CPC ......... H05K 1/0218; H05K 2201/0183; H05K 2201/0707; H05K 2201/095; H05K 2201/10931
See application file for complete search history.

(56) References Cited

U.S. PATENT DOCUMENTS

| | | | |
|---|---|---|---|
| 9,287,220 B2 | 3/2016 | Nam | |
| 2009/0002972 A1* | 1/2009 | Carey | H01L 23/552 |
| | | | 257/E23.114 |
| 2009/0029506 A1* | 1/2009 | Fujii | H01L 23/3121 |
| | | | 257/E21.502 |
| 2018/0138155 A1 | 5/2018 | Kim et al. | |
| 2020/0093041 A1 | 3/2020 | Jung | |
| 2023/0092873 A1* | 3/2023 | Liu | H10W 42/20 |
| | | | 257/659 |

* cited by examiner

*Primary Examiner* — Jeremy C Norris
(74) *Attorney, Agent, or Firm* — Foley and Lardner LLP

(57) ABSTRACT

The present disclosure provides an electronic device. The electronic device includes a substrate, an electronic component, a circuit structure, and a shielding layer. The electronic component is disposed under the substrate. The circuit structure is disposed under the substrate. The shielding layer is disposed under the substrate and covers the electronic component and connected to the circuit structure. The circuit structure and the shielding layer are collectively configured to block the electronic component from electromagnetic interference.

14 Claims, 29 Drawing Sheets

ELECTRONIC DEVICE

BACKGROUND

1. Field of the Disclosure

The present disclosure generally relates to an electronic device, and more particularly to an electronic device including an electromagnetic interference (EMI) shielding structure.

2. Description of the Related Art

To meet characteristic impedance requirements and prevent interference to an electronic device that transmits a signal with a relatively high frequency (e.g., radio frequency (RF) signal) or an input/output signal, an electromagnetic interference (EMI) shielding layer is utilized. However, in some situations, the arrangement of an EMI shielding layer presents manufacturing challenges. For example, when a metal lid is used to function as an EMI shielding layer, it is difficult to fill a molding material within said metal lid, which forms undesired voids and thus degrades the performance of an electronic device. Therefore, a new electronic device is required.

SUMMARY

In some embodiments, an electronic device includes a substrate, an electronic component, a circuit structure, and a shielding layer. The electronic component is disposed under the substrate. The circuit structure is disposed under the substrate. The shielding layer is disposed under the substrate and covers the electronic component and connected to the circuit structure. The circuit structure and the shielding layer are collectively configured to block the electronic component from electromagnetic interference.

In some embodiments, an electronic device includes an electronic component, a circuit structure, an encapsulant, and an EMI shielding layer. The circuit structure is adjacent to the electronic component. The circuit structure has a bottom side configured to provide the electronic device with an external connection. The encapsulant encapsulates the electronic component. The EMI shielding layer is disposed on a lower surface of the encapsulant and at least partially disposed on the bottom side of the circuit structure.

In some embodiments, an electronic device includes an electronic component, a circuit structure, an encapsulant, and an EMI shielding layer. The circuit structure is adjacent to the electronic component and includes a conductive pad. The encapsulant encapsulates the electronic component. The encapsulant and the circuit structure collectively define a step. The EMI shielding layer covers the electronic component. A portion of the EMI shielding layer is disposed on the step and connected to the conductive pad.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
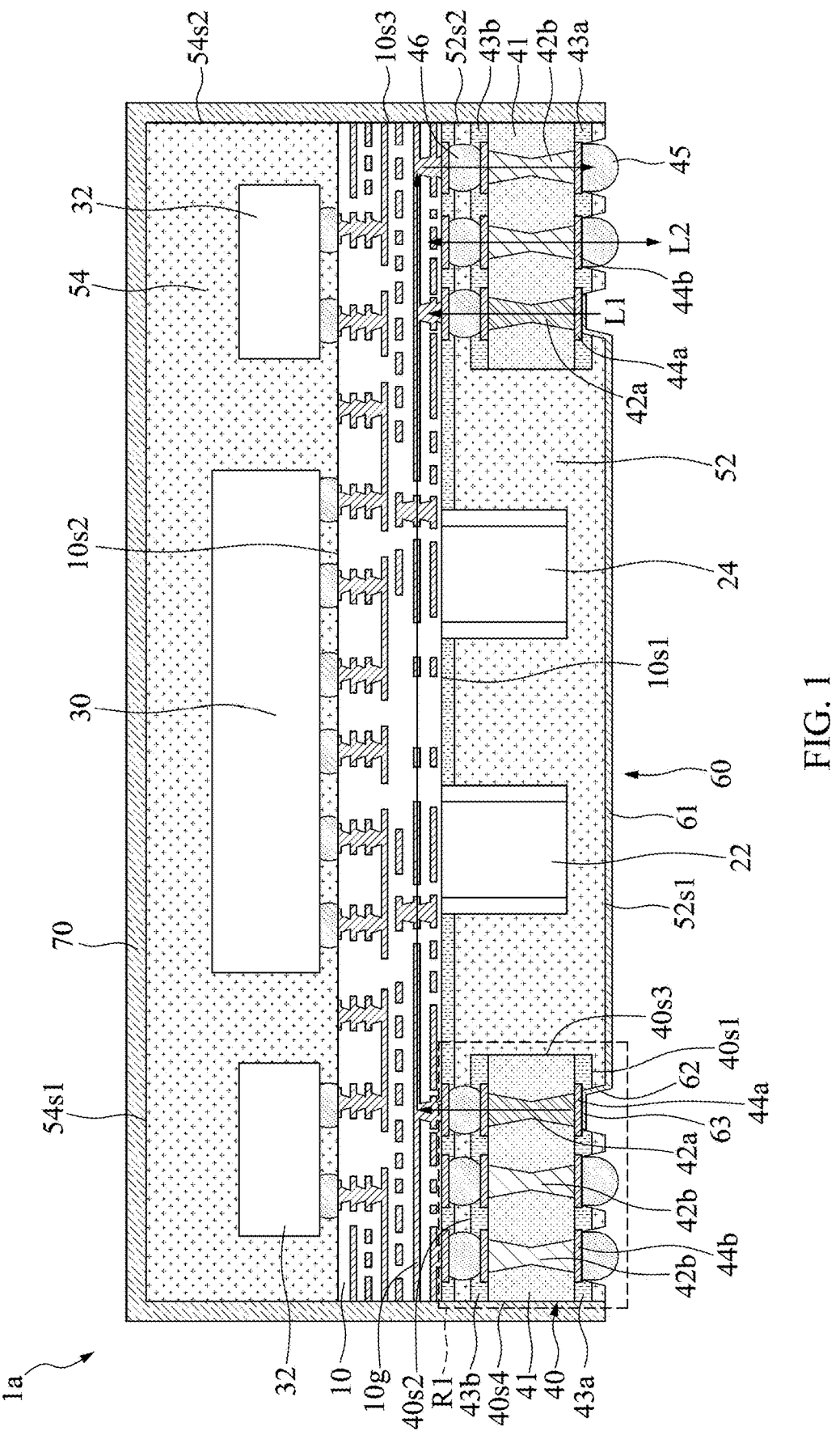
FIG. 1 is a cross-sectional view of an electronic device, in accordance with an embodiment of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-sectional view of an electronic device 1a, in accordance with an embodiment of the present disclosure. In some embodiments, the electronic device 1a may include a substrate 10, an electronic component 22, an electronic component 24, an electronic component 30, electronic components 32, an circuit structure 40, an, encapsulant 52, an encapsulant 54, an EMI shielding layer 60, and an EMI shielding layer 70. In some embodiments, the electronic device 1a may be a package structure which includes a six side shielding structure.

In some embodiments, the substrate 10 (or carrier) may be or include, for example, a printed circuit board, such as a paper-based copper foil laminate, a composite copper foil laminate, or a polymer-impregnated glass-fiber-based copper foil laminate. In this disclosure, the substrate 10 may also be referred to as a substrate. The substrate 10 may have a surface 10s1 (or a lower surface), a surface 10s2 (or an upper surface) opposite to the surface 10s1, and a surface 10s3 (or a lateral surface) extending between the surface 10s1 and the surface 10s2. In some embodiments, the substrate 10 may include a conductive pad(s), trace(s), via(s), layer(s), or other interconnection(s). For example, the substrate 10 may include one or more transmission lines (e.g., communications cables) and one or more grounding lines and/or grounding planes. For example, the substrate 10 may include one or more conductive pads (not shown in the figures) in proximity to, adjacent to, or embedded in and exposed by the surface 10s1 and/or the surface 10s2 of the substrate 10. The substrate 10 may include a solder resist (not shown in the figures) on the surface 10s1 and/or the surface 10s2 to fully expose or expose at least a portion of the conductive pads for electrical connections. The substrate 10 may include a ground trace 10g. The ground trace 10g may electrically connected to ground.

The electronic components 22 and 24 may be disposed on or below the surface 10s1 of the substrate 10. Each of the electronic components 22 and 24 may be electrically connected to the substrate 10. Each of the electronic components 22 and 24 may include a logic die (e.g., an application-specific IC (ASIC), application processor (AP), system-on-a-chip (SoC), central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. In some embodiments, each of the electronic components 22 and 24 may include a passive device, such as an inductor, a resistor, and/or a capacitor.

The electronic component 30 may be disposed on or over the surface 10s2 of the substrate 10. The electronic component 30 may be electrically connected to the substrate 10. The electronic component 30 may include a logic die (e.g., an application-specific IC, application processor, system-on-a-chip, central processing unit, graphics processing unit, microcontroller, etc.), a memory die (e.g., dynamic random access memory die, static random access memory die, etc.), a power management die (e.g., power management integrated circuit die), a radio frequency die, a sensor die, a micro-electro-mechanical-system die, a signal processing die (e.g., digital signal processing die), a front-end die (e.g., analog front-end dies) or other active components.

The electronic component 32 may be disposed on or over the surface 10s2 of the substrate 10. The electronic component 32 may be electrically connected to the substrate 10. The electronic component 32 may include a passive device, such as a capacitor, an inductor, or other suitable passive devices.

In some embodiments, the circuit structure 40 (or interposer) may be disposed on or below the surface 10s1 of the substrate 10. In some embodiments, the circuit structure 40 may disposed at a peripheral region of the substrate 10. In some embodiments, the circuit structure 40 may be configured to receive and/or transmit a non-ground signal (e.g., an input/out (I/O) signal). In some embodiments, the circuit structure 40 may be configured to receive and/or transmit a ground signal to reduce electromagnetic interference (EMI) between components and/or traces. The circuit structure 40 may have a surface 40s1 (or a lower surface), a surface 40s2 (or an upper surface) opposite to the surface 40s1, a surface 40s3 (or an inner lateral surface) facing the electronic component 22 (or electronic component 24), and a surface 40s4 (or an outer lateral surface) opposite to the surface 40s3. In some embodiments, the circuit structure 40 may include a substrate 41, conductive elements 42a (or element), conductive elements 42b (or element), as well as dielectric layers 43a and 43b.

The substrate 41 (or a core substrate) may encapsulate the conductive elements 42a and conductive elements 42b. The substrate 41 may include or be composed of multiple dielectric layers. The substrate 41 may include, for example, polyimide (PI), polyimide-isoindoloquinazolinedione (PIQ), polybenzoxazole (PBO), benzocyclobutene (BCB), or other suitable materials.

In some embodiments, the conductive element 42a may be disposed within the substrate 41 of the circuit structure 40. The conductive element 42a may include a conductive via that at least partially penetrates the substrate 41. In some embodiments, the conductive element 42a may be disposed between the conductive element 42b and the electronic component 22 (or electronic component 24). The conductive elements 42a may be disposed on opposite two sides of the electronic component 22 (or electronic component 24) or surround the electronic component 22 (or electronic component 24). In some embodiments, the conductive element 42a is closer to the surface 40s3 than the conductive element 42b is. In some embodiments, the conductive element 42a may be electrically connected to ground or configured to transmit a ground signal, leading to a decrease of EMI interference between the conductive element 42b and the electronic component 22 (or electronic component 24). The electronic components 22 and 24 may be sensitive to the EMI from external devices (e.g., RF devices). The conductive element 42a may block (or shield) the electronic components 22 and 24 from external EMI.

The conductive element 42b may be disposed within the substrate 41 of the circuit structure 40. The conductive element 42b may include a conductive via that at least partially penetrates the substrate 41. In some embodiments, the conductive element 42b may be spaced apart from the electronic component 22 (or electronic component 24) by the conductive element 42a. In some embodiments, the conductive element 42 may be configured to transmit a non-ground signal, such as an I/O signal. The conductive element 42b may function as a part of a signal delivery structure. In some embodiments, each of the conductive element 42a and conductive element 42b may include a seed layer (not shown) and a conductive material (not shown) formed on the seed layer. The seed layer may include titanium, titanium nitride, or other suitable materials. The conductive material may include copper, silver, aluminum, or other suitable materials.

Figure 2:
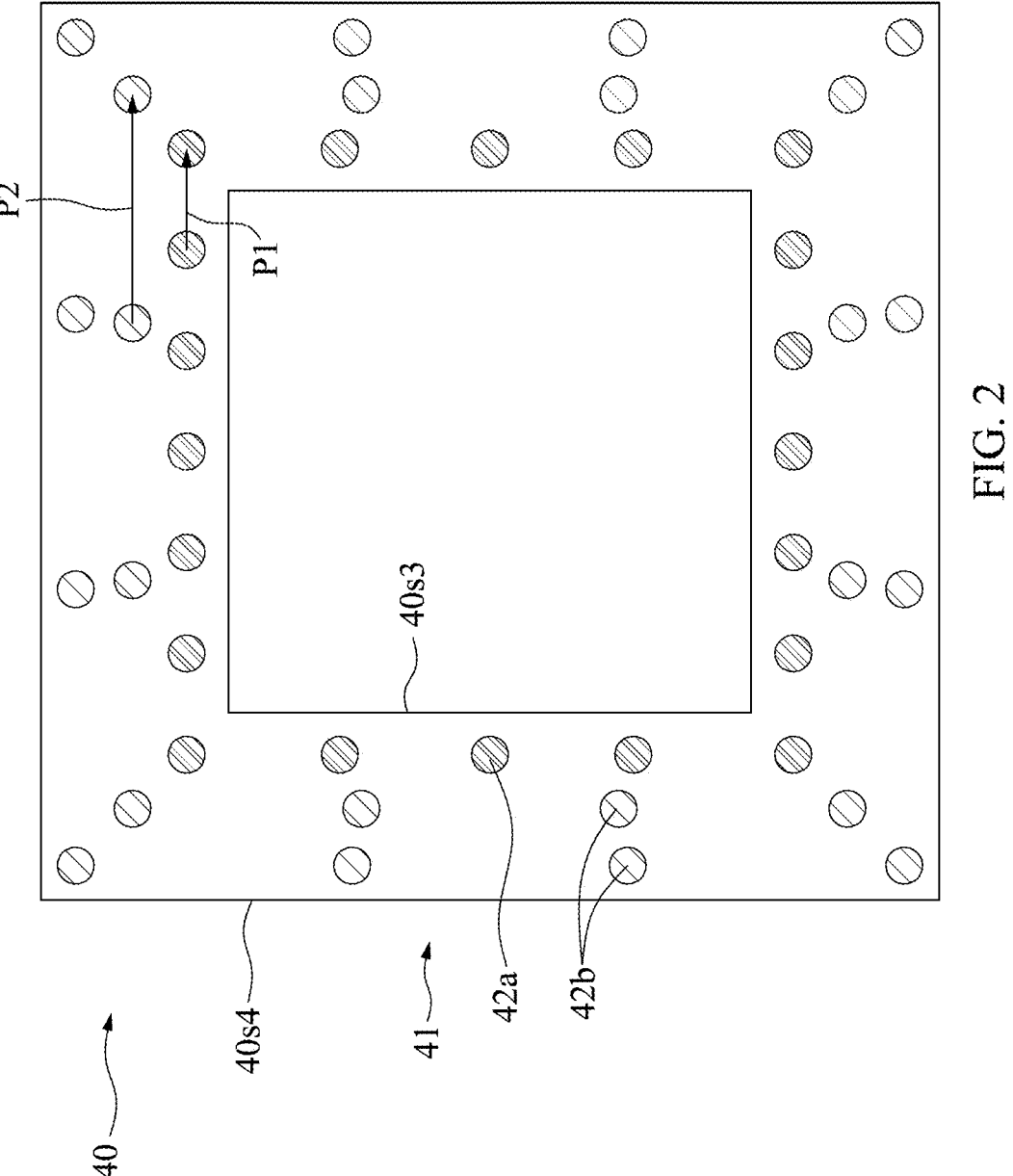
FIG. 2 illustrates a partial layout of an circuit structure, in accordance with an embodiment of the present disclosure.

FIG. 2 illustrates a layout of the circuit structure 40. The substrate 41 may include multiple dielectric layers, each of which has a ring-shaped profile. In some embodiments, the conductive elements 42a may be located within the innermost dielectric layer of the substrate 41. The conductive elements 42b may surround the conductive elements 42a. The conductive elements 42b may be located within outer dielectric layers of the substrate 41. The conductive elements 42a may define a pitch P1. The conductive elements 42b may define a pitch P2. In some embodiments, the pitch P2 (or average distance between the conductive elements 42b) may be greater than the pitch P1 (or average distance between the conductive elements 42a). Since the pitch P1 is relatively small, EMI (e.g., EMI with greater frequency) can be blocked more effectively. In some embodiments, the density of the conductive elements 42a may be greater than the density of the conductive elements 42b. As used herein, the term "density" may refer to the number of elements (e.g., conductive elements) per unit area.

Referring back to FIG. 1, the dielectric layer 43a is disposed adjacent to the surface 40s1 of the circuit structure 40. The dielectric layer 43b is disposed adjacent to the surface 40s2 of the circuit structure 40. The dielectric layer 43a (or 43b) may cover the substrate 41 (e.g., the lower surface and upper surface of the substrate 41). The dielectric layer 43a (or 43b) may be disposed between the encapsulant 52 and the substrate 41. The dielectric layer 43a (or 43b) may include a solder resist, which defines a space exposing terminals 44a and terminals 44b of the circuit structure 40. The terminal 44a may be electrically connected to the conductive element 42a. The terminal 44a may include a conductive pad or other suitable elements. The terminal 44b may be electrically connected to the conductive element 42b. The terminal 44b may include a conductive pad or other suitable elements. In some embodiments, each of the terminal 44a and terminal 44b may include a seed layer (e.g., titanium, titanium nitride, or other suitable materials) and a conductive material (e.g., copper or other suitable materials). The lower surface and upper surface of the dielectric layers 43a and 43b may be regarded as the surface 40s1 and the surface 40s2 of the circuit structure 40, respectively.

The electronic device 1a may include electrical connectors 45 (or electrical contacts). The electrical connector 45 may be disposed on or below the surface 40s1 of the circuit structure 40. The electrical connector 45 may be configured to electrically connect the electronic device 1a to an external device (not shown). The electrical connector may include a soldering material (or soldering element), such as alloys of gold and tin solder or alloys of silver and tin solder.

The electronic device 1a may include electrical connectors 46 (or electrical contacts). The electrical connector 46 may be disposed on or over the surface 40s2 of the circuit structure 40. The electrical connector 46 may be configured to electrically connect the circuit structure 40 and the substrate 10. The electrical connector 46 may include a solder material (or solder element), such as alloys of gold and tin solder or alloys of silver and tin solder. In some embodiments, the quantity of the electrical connectors 46 may be different from that of the electrical connectors 45. In some embodiments, the quantity of the electrical connectors 46 may be different from that of the electrical connectors 45 in a cross-sectional view. In some embodiments, the quantity of the electrical connectors 46 may be greater than that of the electrical connectors 45. In some embodiments, the quantity of the electrical connectors 46 may be greater than that of the electrical connectors 45 in a cross-sectional view.

In some embodiments, the encapsulant 52 may be disposed on or below the surface 10s1 of the substrate 10. In some embodiments, the encapsulant 52 may encapsulate the electronic component 22 and the electronic component 24. In some embodiments, the encapsulant 52 may encapsulate the electrical connectors 46. The encapsulant 52 may cover the surface 40s1 of the circuit structure 40. The encapsulant 52 may cover the surface 40s2 of the circuit structure 40. In some embodiments, the encapsulant 52 may be in contact with the surface 40s3 of the circuit structure 40. In some embodiments, the encapsulant 52 may be spaced apart from the surface 40s4 of the circuit structure 40. The encapsulant 52 may include a novolac-based resin, an epoxy-based resin, a silicone-based resin, or another suitable material. Suitable fillers may also be included, such as powdered $SiO_2$. The encapsulant 52 may have a surface 52s1 (or a lower surface) and a surface 52s2 (or a lateral surface). In some embodiments, the surface 52s2 of the encapsulant 52 may be substantially aligned with the surface 10s3 of the substrate 10. In some embodiments, the surface 52s2 of the encapsulant 52 may be substantially aligned with the surface 40s4 of the circuit structure 40. The electrical connector 45 may be exposed by the surface 52s1 of the encapsulant 52.

In some embodiments, the encapsulant 54 may be disposed on or over the surface 10s2 of the substrate 10. In some embodiments, the encapsulant 54 may encapsulate the electronic component 30. The encapsulant 54 may be spaced apart from the encapsulant 52 by the substrate 10. The encapsulant 54 may include a novolac-based resin, an epoxy-based resin, a silicone-based resin, or another suitable material. Suitable fillers may also be included, such as powdered $SiO_2$. The encapsulant 54 may have a surface 54s1 (or an upper surface) and a surface 54s2 (or a lateral surface). In some embodiments, the surface 54s2 of the encapsulant 54 may be substantially aligned with the surface 10s3 of the substrate 10.

In some embodiments, the EMI shielding layer 60 (or a grounding layer) may be disposed on or below the surface 52s1 of the encapsulant 52. In some embodiments, the EMI shielding layer 60 may be electrically connected to ground. In some embodiments, the EMI shielding layer 60 may be electrically connected to the ground trace 10g. In some embodiments, the EMI shielding layer 60 may be configured to receive and/or transmit a ground signal. In some embodiments, the EMI shielding layer 60 may cover or vertically overlap the electronic component 22 and the electronic component 24 to prevent EMI from a component below the electronic device 1a. In some embodiments, the EMI shielding layer 60 may be electrically connected to the conductive element 42a of the circuit structure 40 through the terminal 44a. In some embodiments, the EMI shielding layer 60 may be electrically isolated from the conductive element 42b of the circuit structure 40.

Figure 3:
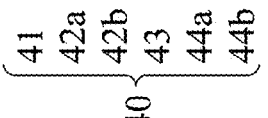
FIG. 3 illustrates a partial enlarged view of the electronic device as shown in FIG. 1, in accordance with an embodiment of the present disclosure.

FIG. 3 illustrates a partial enlarged view of region R1 as shown in FIG. 1. In some embodiments, the encapsulant 52 may define multiple recesses, such as recesses 52r1, 52r2, and 52r3. The encapsulant 52 may have a surface 52s3 and a surface 52s4 serving as a side (or lateral surface) of the recess 52r1. Although FIG. 3 illustrates that the surface 52s3 is separated from the surface 52s4, it should be noted that the recess 52r1 may have a substantially circular profile (or an elliptical profile) in a bottom view so that the surface 52s3 may be connected to the surface 52s4. The recess 52r1 may expose the terminals 44a. The recess 52r2 (or recess 52r3) may expose the terminals 44b. In some embodiments, the electrical connector 45 may be disposed within the recess 52r2. In some embodiments, the electrical connector 45 may be disposed within the recess 52r3. In some embodiments, the recess 52r1 may be free of solder elements or solder material(s). In some embodiments, the lateral surface (not annotated) of the dielectric layer 43a of the circuit structure 40 and the surfaces 52s3 and 52s4 of the encapsulant 52 may function as a side of the recess 52r1 (or recess 52r2 or 52r3). The lateral surface of the dielectric layer 43a may be substantially aligned with the surface 52s3 (or surface 52s4) of the encapsulant 52. The encapsulant 52 may have a surface 52s5 spaced apart from the surface 52s1 by the recess 52r1. Although FIG. 3 illustrates that the surface 52s1 is separated from the surface 52s5 in a cross-sectional view, it should be notated that the surfaces 52s1 is connected to the surface 52s5 in a bottom view.

In some embodiments, the encapsulant 52 and the circuit structure 40 may collectively define a step 40t. The lower surface of the substrate 41 and the surfaces 52s1 and 52s3 of the encapsulant 52 define the step 40t. The step 40t may expose a portion of the terminal 44a. The EMI shielding layer 60 may be disposed on the step 40t.

In some embodiments, the EMI shielding layer 60 may include portions 61, 62, and 63. The portion 61 may be disposed on or below the surface 52s1 of the encapsulant 52. In some embodiments, the portion 61 may be in contact with the encapsulant 52.

In some embodiments, the portion 62 (or a connecting portion) may be disposed on the surface 52s3 of the encapsulant 52. The portion 62 may connect the portions 61 and 63. In some embodiments, the portion 62 may be disposed within the recess 52r1 of the encapsulant 52. In some embodiments, the portion 62 may be in contact with the encapsulant 52.

In some embodiments, the portion 63 may be disposed on or below the terminal 44a. In some embodiments, the portion 63 may be disposed within the recess 52r1. In some embodiments, the portion 63 may be spaced apart from the encapsulant 52 by the dielectric layer 43a.

In some embodiments, the surface 52s4 may be exposed by the EMI shielding layer 60. That is, a portion of the lateral surface that defines the recess 52r1 is exposed by the EMI shielding layer 60.

In some embodiments, the EMI shielding layer 60 may have an uneven thickness. The portion 61 may have a thickness T1, which may be defined as a minimum distance between an outer surface of the portion 61 of the EMI shielding layer 60 and the encapsulant 52. The portion 62 may have a thickness T2, which may be defined as a minimum distance between an outer surface of the portion 62 of the EMI shielding layer 60 and the encapsulant 52. The portion 63 may have a thickness T3, which may be defined as a minimum distance between an outer surface of the portion 63 of the EMI shielding layer 60 and the terminal 44a. In some embodiments, the thickness T1 may be greater than the thickness T2. In some embodiments, the thickness T1 may be greater than the thickness T3. In some embodiments, the thickness T3 may be equal to or greater than the thickness T2. In some embodiments, the ratio of the thickness T1 to the thickness T2 may range from about 1.1 to about 1.5, such as 1.1, 1.2, 1.3, 1.4, or 1.5.

In some embodiments, the portion 61 may be regarded as a substantial horizontal part ES1 of an EMI shielding structure ES. In some embodiments, the portion 63, the terminal 44a, and the conductive element 42a may collectively be regarded as a substantial vertical part ES2 of the EMI shielding structure ES. The substantial horizontal part ES1 may be substantially orthogonal to the substantial vertical part ES2. In some embodiments, the substantial horizontal part ES1 of the EMI shielding structure ES may be in contact with the encapsulant 52. In some embodiments, the substantial horizontal part ES2 of the EMI shielding structure ES may be spaced apart from the encapsulant 52. The substantial horizontal part ES2 may be connected to the substantial horizontal part ES1 by the portion 62 of the EMI shielding layer 60. The portion 62 may be slanted with respect to the substantial horizontal part ES1. The portion 62 may be slanted with respect to the substantial vertical part ES2.

In some embodiments, a gap 52g may be defined between the lower surface 43as1 of the dielectric layer 43a and the surface 52s1 of the encapsulant 52. In some embodiments, the lower surface 43as1 of the dielectric layer 43a may have an elevation lower than the elevation of the lower surface (not annotated) of the portion 63 of the EMI shielding layer 60. In some embodiments, the surface 60s1 (or lower surface) of the EMI shielding layer 60 may have an elevation lower than that of the bottom of the electrical connector 45.

Figure 4:
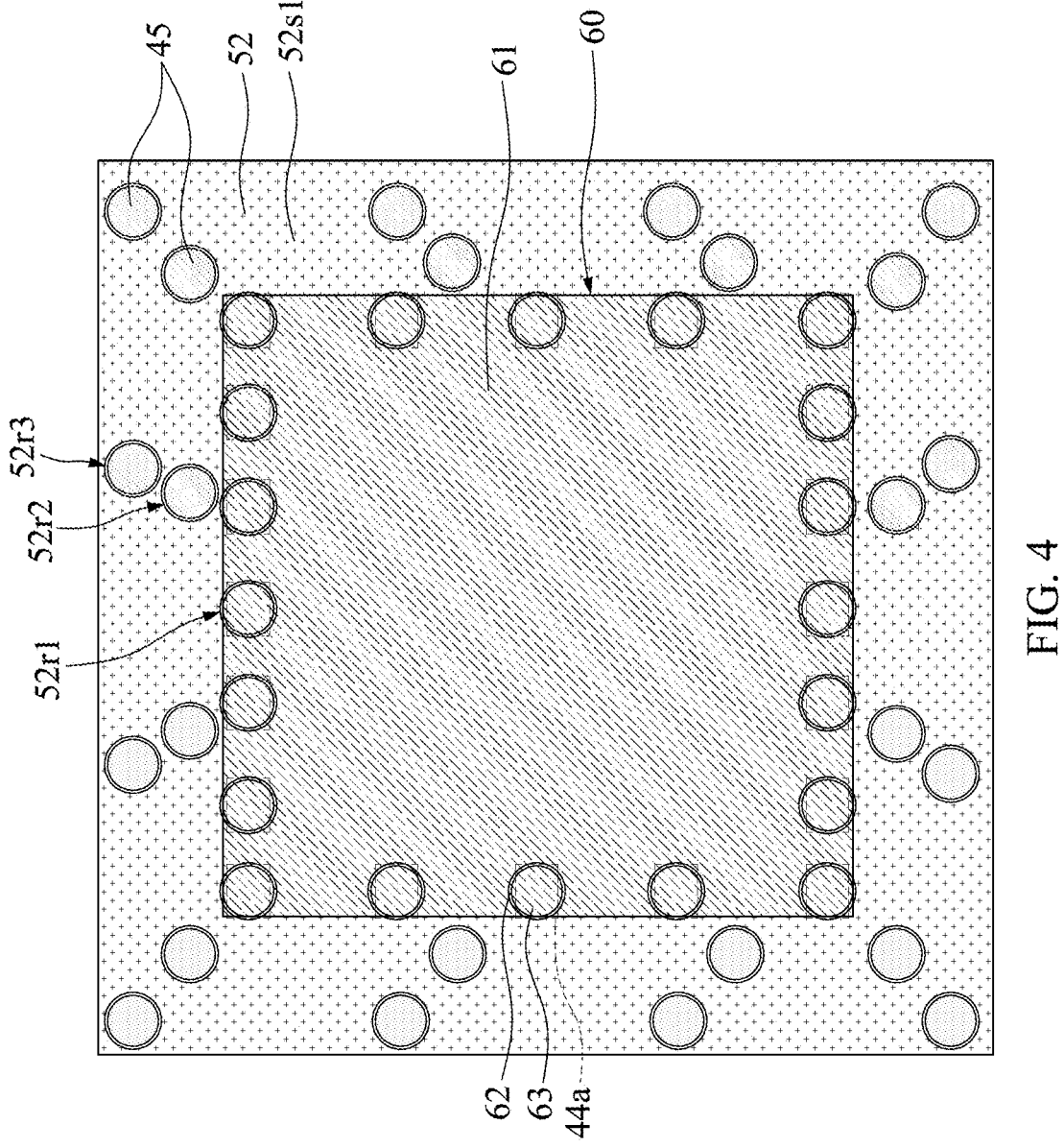
FIG. 4 illustrates a partial layout of the electronic device as shown in FIG. 1, in accordance with an embodiment of the present disclosure.

FIG. 4 illustrates a layout of the encapsulant 52 and the EMI shielding layer 60 in a bottom view. It should be noted that some elements are omitted for brevity. In some embodiments, each of the recesses 52r1, 52r2, and 52r3 may have a circular profile, an elliptical profile, or other suitable profile. In other embodiments, each of the recesses 52r1, 52r2, and 52r3 may have a rectangular profile. The terminal 44a may be exposed by the recess 52r1 and covered by the portion 63. Although FIG. 4 illustrates that the terminal 44a has a rectangle profile in a bottom view, the terminal 44a may have other profiles, such as a circular profile. The portion 63 may be located on an exposed portion of the terminal 44a. The portion 62 may extend between the portions 61 and 63.

Figure 5:
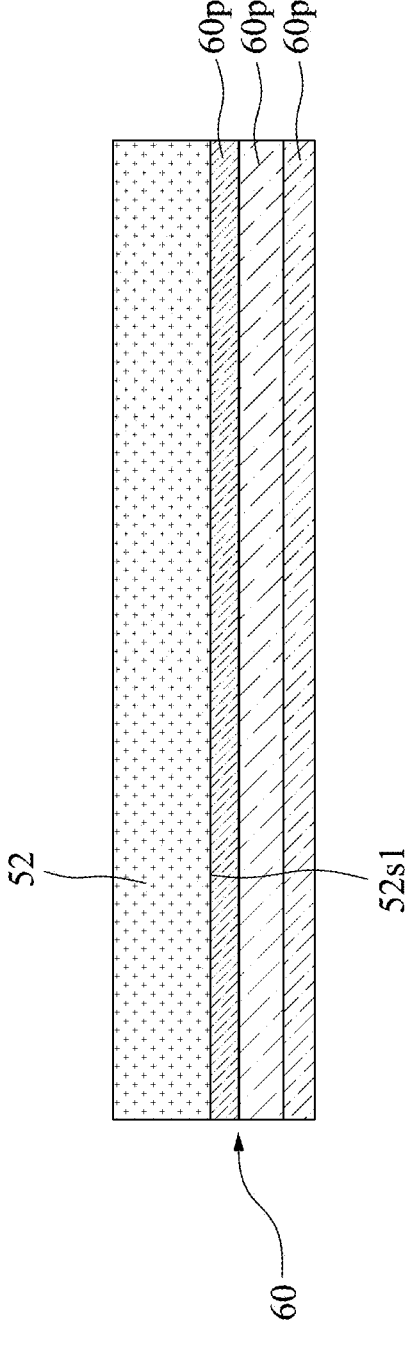
FIG. 5 is a cross-sectional view of an electronic device, in accordance with an embodiment of the present disclosure.

FIG. 5 illustrates an enlarged view of the EMI shielding layer 60. In some embodiments, the composition of the EMI shielding layer 60 may be different from that of the conductive element 42*a* (or 42*b*). In some embodiments, the EMI shielding layer 60 may include an adhesion metal layer 60*p*1, one or more intervening metal layers 60*p*2, and a protection metal layer 60*p*3. The adhesion metal layer 60*p*1 may face the encapsulant 52. The intervening metal layer(s) 60*p*2 may be sandwiched by the adhesion metal layer 60*p*1 and protection metal layer 60*p*3. The adhesion metal layer 60*p*1 may have relatively good adhesion to the encapsulant 52 to prevent the EMI shielding layer 60 from peeling off from the encapsulant 52. The adhesion metal layer 60*p*1 may include, for example, stainless steel or other suitable materials. The intervening metal layer 60*p*2 may have relatively good ductility and shield ability to block the electronic components (e.g., electronic components 22 and 24) from interfering signals (e.g., light or other optical signals) in the surrounding environment. The intervening metal layer 60*p*2 may include, for example, copper or other suitable materials. The protection metal layer 60*p*3 may be configured to protect the intervening metal layer 60*p*2 from oxidation. The protection metal layer 60*p*3 may include, for example, stainless steel or other suitable materials.

Referring back to FIG. 1, the EMI shielding layer 70 (or a grounding layer) may be disposed on or over the surface 54*s*1 of the encapsulant 54. The EMI shielding layer 70 may be configured to prevent EMI in the electronic components 22, 24, and/or 30 from outside the electronic device 1*a*. The EMI shielding layer 70 may cover the surface 54*s*2 of the encapsulant 54. The EMI shielding layer 70 may cover the surface 10*s*3 of the substrate 10. The EMI shielding layer 70 may cover and be in contact with the surface 40*s*4 of the circuit structure 40. The EMI shielding layer 70 may cover and be in contact with the surface 52*s*2 of the encapsulant 52. In some embodiments, the EMI shielding layer 70 may be electrically connected to ground. The EMI shielding layer 70 may be electrically connected to the substrate 10. In some embodiments, the EMI shielding layer 70 may be spaced apart from the EMI shielding layer 60.

As shown in FIG. 1, the electronic device 1*a* may include a path L1 for transmitting a ground signal. The path L1 may pass through the EMI shielding layer 60 and the conductive element 42*a*. The electronic device 1*a* may include a path L2 for transmitting a non-ground signal (e.g., an I/O signal). The path L1 may pass across the electronic components 22 and 24. The path L1 may be connected to the ground trace 10*g*. The path L1 may be connected to the EMI shielding layer 70. The path L2 may pass through the electrical connector 45 and the conductive element 42*b*. It should be noted that some conductive elements 42*b* are configured to transmit a ground signal to an external device (e.g., a printed circuit board) which provides a power source connected to ground.

In a comparative example, a metal lid is utilized to function as an EMI shielding layer. The metal lid may include a top plate with an opening and four sidewalls connected to the top plate. In some conditions, after the four sidewalls of the metal lid are attached to a carrier, a molding material is filled into the inner space of the metal lid through the opening of the top plate. Since the size of the opening should be relatively small to ensure shielding performance, it is difficult to fill the molding material within the metal lid through such small opening, leading to voids formed within the molding material. As a result, the reliability of an electronic device is degraded. In some embodiments of the present disclosure, the metal lid is replaced with the conductive elements 42*a* of the circuit structure 40 and the EMI shielding layer 60. The EMI shielding layer 60 is formed after the formation of the encapsulant 52. Further, the conductive elements 42*a* and the EMI shielding layer 60 are not formed in one piece. Therefore, the aforesaid issues of the comparative example are avoided, leading to an improvement of the reliability of the electronic device 1*a*.

Figure 6A:
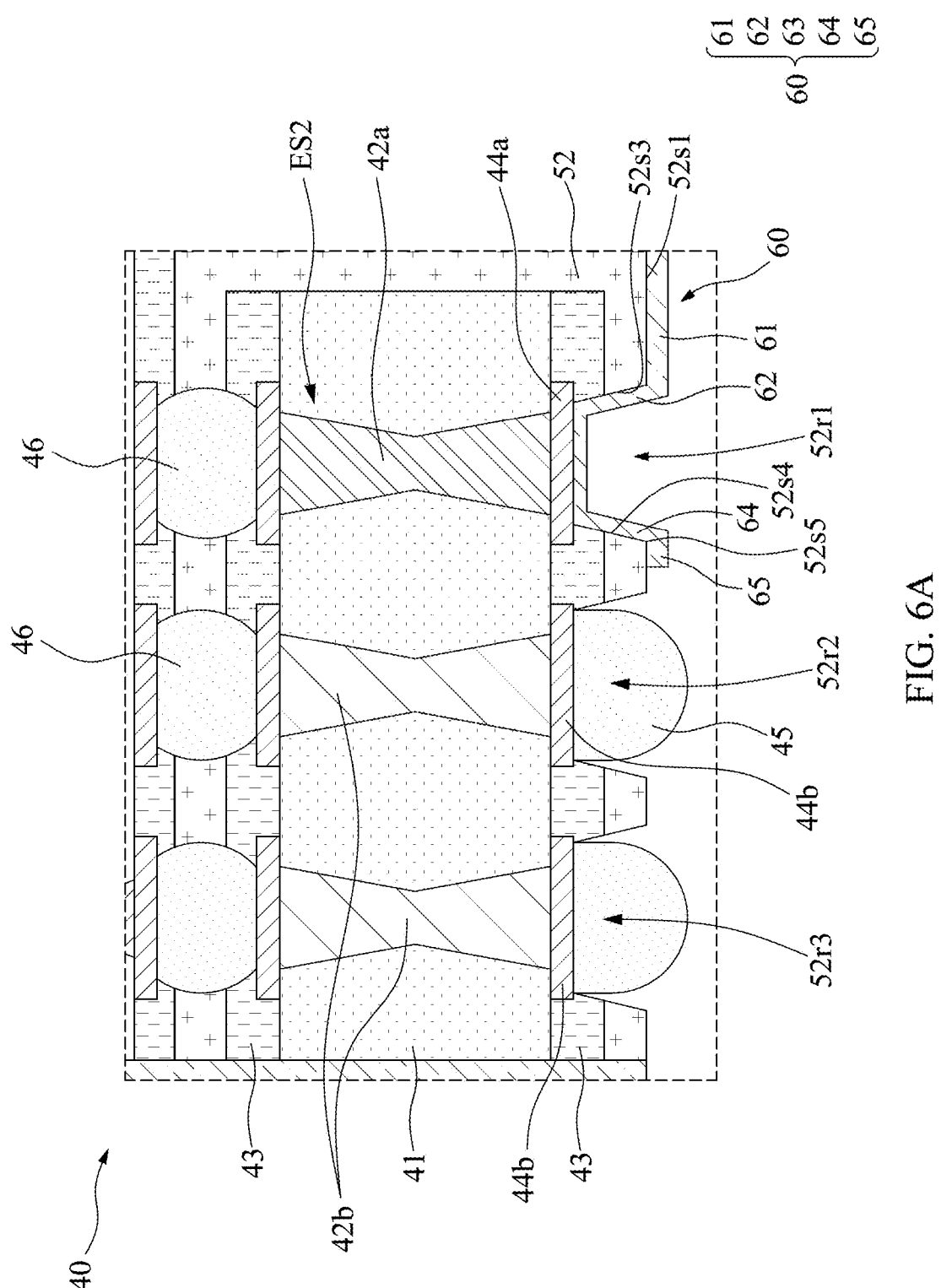
FIG. 6A is a cross-sectional view of an electronic device, in accordance with an embodiment of the present disclosure.

FIG. 6A is a cross-sectional view of an electronic device 1*b*, in accordance with an embodiment of the present disclosure. The electronic device 1*b* is similar to the electronic device 1*a*, with differences therebetween as follows.

In some embodiments, the EMI shielding layer 60 may extend between the recesses 52*r*1 and 52*r*2. The EMI shielding layer 60 may include portions 64 and 65. The portion 64 may be disposed on the surface 52*s*4. The portion 64 may extend between the portions 63 and 65. The portion 64 may be spaced apart from the portion 62 in a cross-sectional view. The portion 65 may be disposed on a part of the surface 52*s*5 that is located between the recesses 52*r*1 and 52*r*2. The portion 65 may be spaced apart from the portion 61 in a cross-sectional view. In some embodiments, the thickness (not annotated) of the portion 65 may be substantially the same as that of the portion 61. In some embodiments, the thickness of the portion 64 (not annotated) may be substantially the same as that of the portion 62. In this embodiment, the EMI shielding layer 60 further includes the portion 65. The portion 65 may completely cover an exposed portion of the terminal 44*a*, which thereby enhances the EMI shielding performance. The formation of the portion 65 will be described in FIG. 25 and FIG. 26.

Figure 6B:
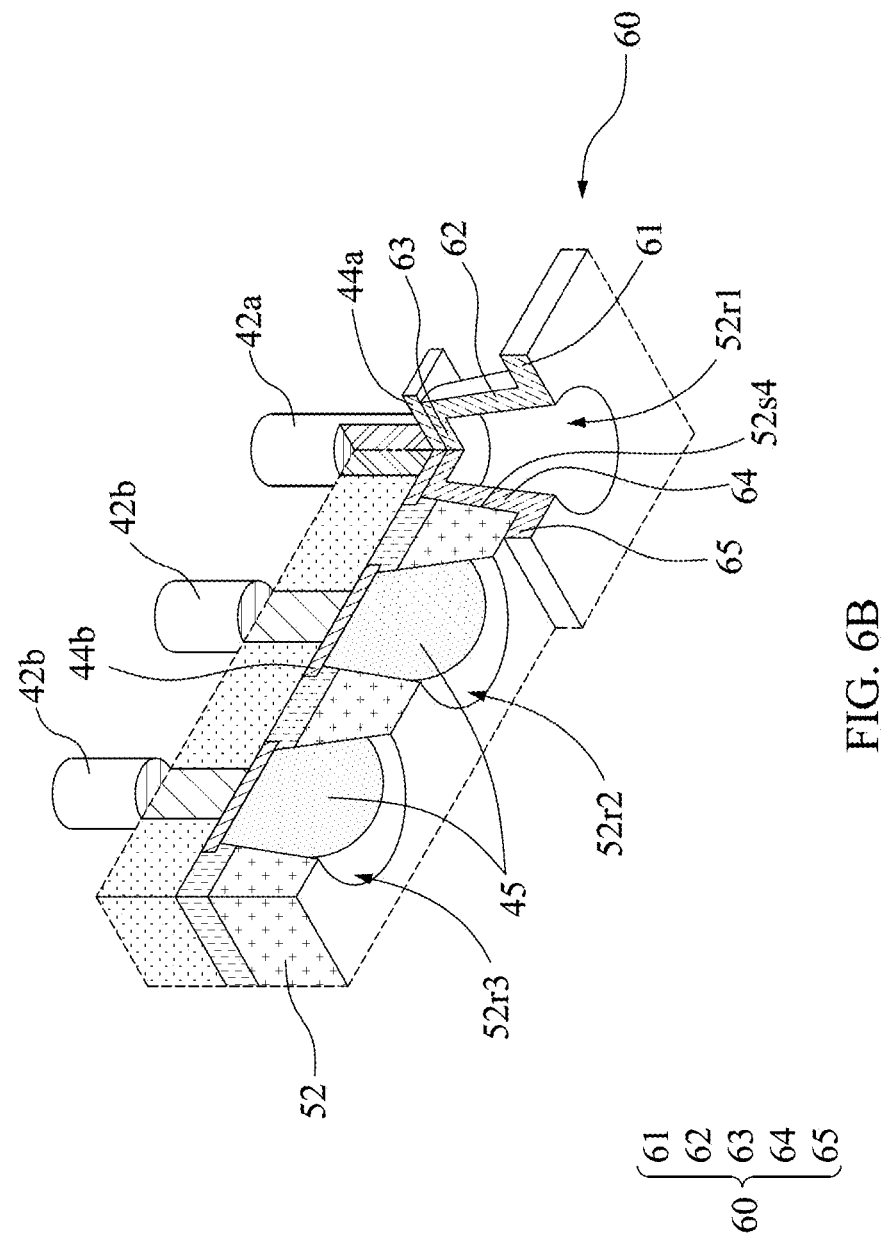
FIG. 6B is a perspective view of the electronic device as shown in FIG. 6A, in accordance with an embodiment of the present disclosure.

FIG. 6B is a perspective view of the electronic device 1*b* as shown in FIG. 6A, in accordance with an embodiment of the present disclosure. In some embodiments, the portions 62 and 64 may be parts of a substantially circular ring (or a substantially elliptical ring). The aperture of the substantially circular ring (or the substantially elliptical ring) may be tapered toward the terminal 44*a*. The portions 61 and 65 may be parts of a bottom plate that is connected to the substantially circular ring (or the substantially elliptical ring). The portion 63 may have a substantially circular profile (or a substantially elliptical profile) covering the terminal 44*a*.

Figure 7:
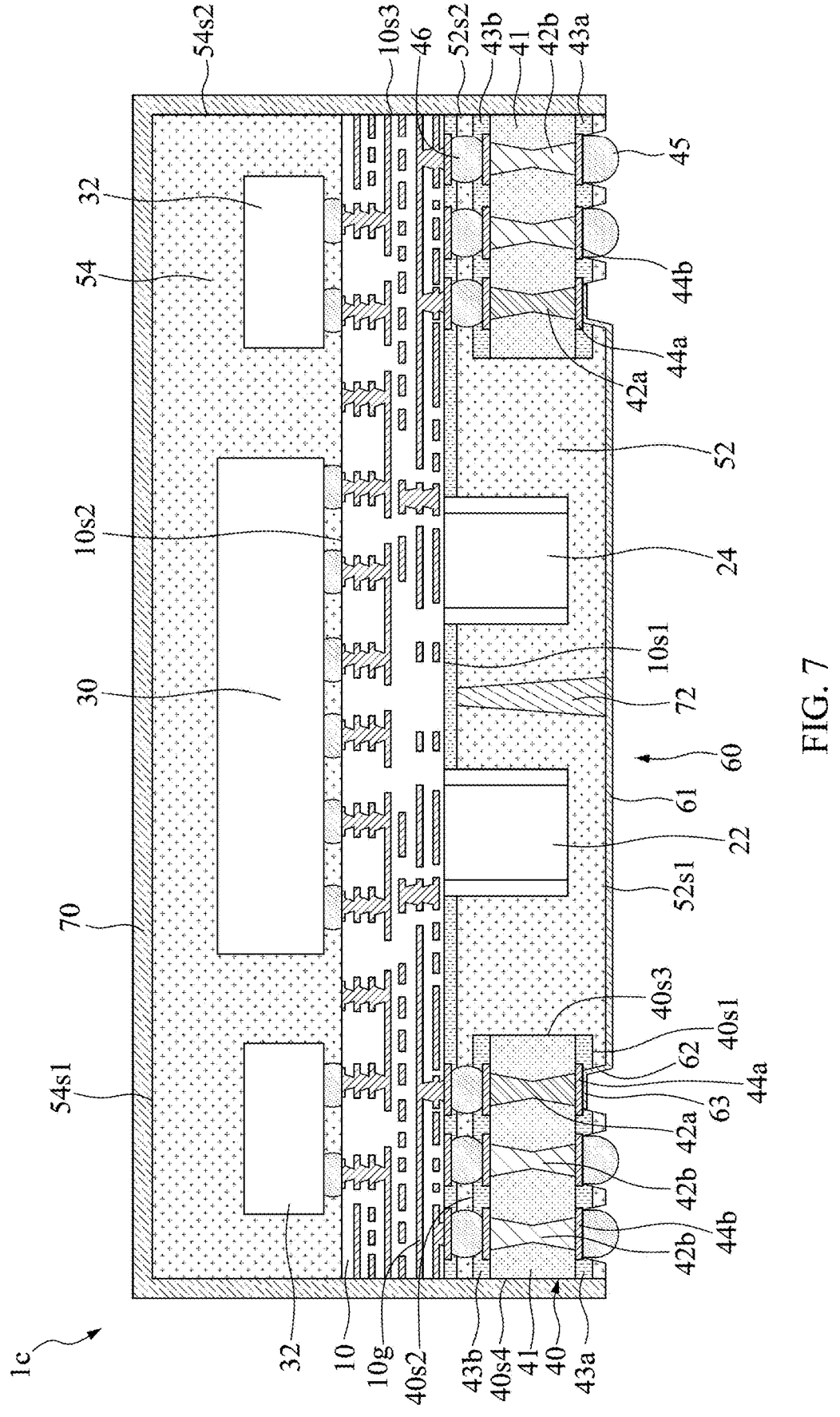
FIG. 7 is a cross-sectional view of an electronic device, in accordance with an embodiment of the present disclosure.

FIG. 7 is a cross-sectional view of an electronic device 1*c*, in accordance with an embodiment of the present disclosure. The electronic device 1*c* is similar to the electronic device 1*a*, with differences therebetween as follows.

In some embodiments, the electronic device 1*c* may include a compartment structure 72. In some embodiments, the compartment structure 72 may be disposed between the electronic components 22 and 24. In some embodiments, the compartment structure 72 may penetrate the encapsulant 52. In some embodiments, the compartment structure 72 may extend between the surface 10*s*1 of the substrate 10 and the EMI shielding layer 60. In some embodiments, the compartment structure 72 may be electrically connected to the substrate 10. In some embodiments, the compartment structure 72 may be electrically connected to the ground trace 10*g*. In some embodiments, the compartment structure 72 may be electrically connected to the EMI shielding layer 60. In some embodiments, the compartment structure 72 may be configured to reduce the EMI between the electronic components 22 and 24. In some embodiments, the compartment structure 72 may include a seed layer (e.g., titanium, titanium nitride, or other suitable materials) and a conductive material (e.g., copper or other suitable materials).

Figure 8:
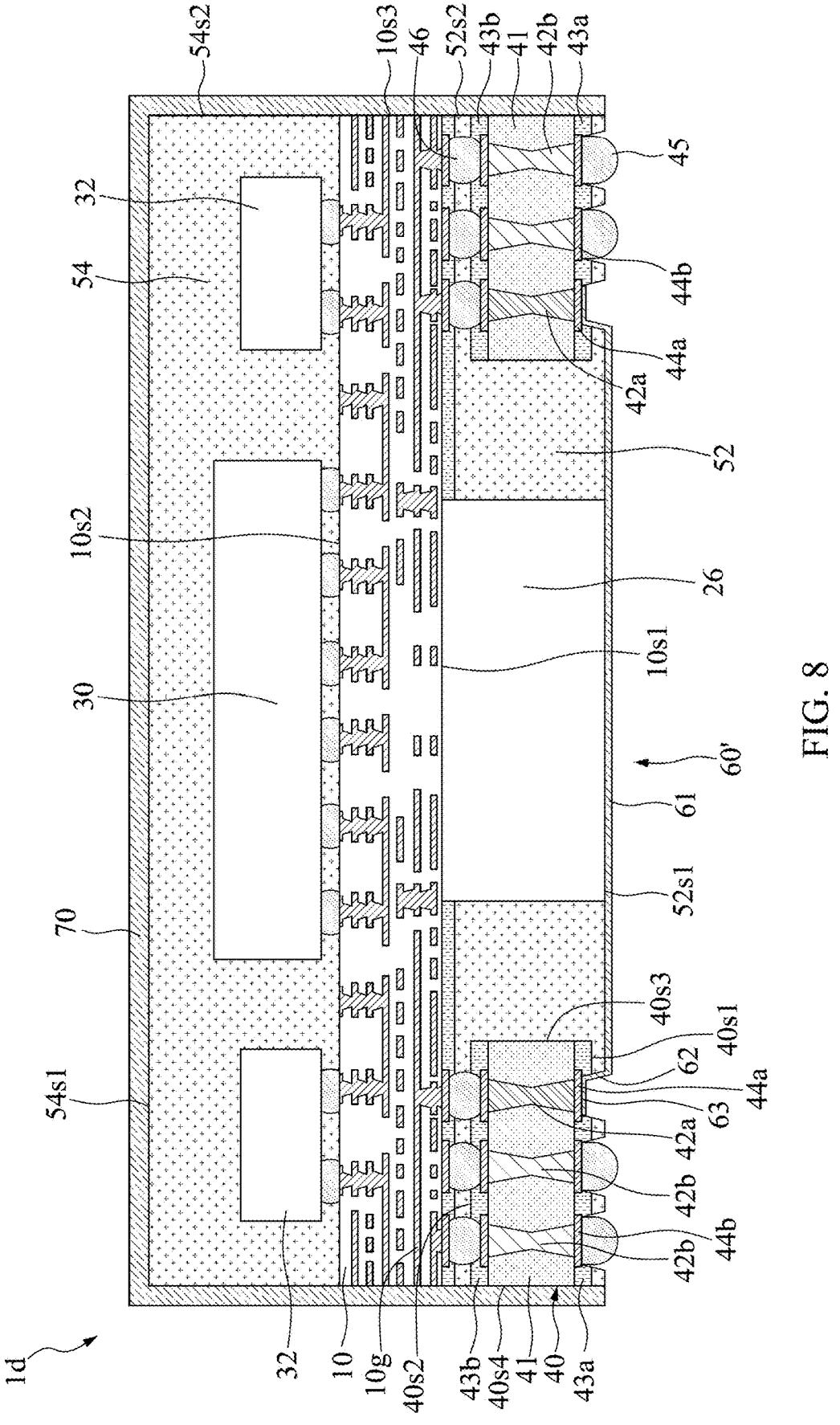
FIG. 8 is a cross-sectional view of an electronic device, in accordance with an embodiment of the present disclosure.

FIG. 8 is a cross-sectional view of an electronic device 1*d*, in accordance with an embodiment of the present disclosure. The electronic device 1*d* is similar to the electronic device 1*a*, with differences therebetween as follows.

In some embodiments, the electronic device 1*d* may include an electronic component 26. The electronic component 26 may be disposed on or below the surface 10*s*1 of the substrate 10. The electronic component 26 may be electrically connected to the substrate 10. The electronic component 26 may include a logic die (e.g., an application-specific IC, application processor, system-on-a-chip, central processing unit, graphics processing unit, microcontroller, etc.), a memory die (e.g., dynamic random access memory die, static random access memory die, etc.), a power management die (e.g., power management integrated circuit die), a radio frequency die, a sensor die, a micro-electro-mechanical-system die, a signal processing die (e.g., digital signal processing die), a front-end die (e.g., analog front-end dies) or other active components. In some embodiments, the lower surface (not annotated) of the electronic component 26 may be exposed by the surface 52*s*1 of the encapsulant 52. In some embodiments, the electronic component 26 may be in contact with the EMI shielding layer 60'. In some embodiments, the adhesion metal layer, intervening metal layer(s), and protection metal layer of the EMI shielding layer 60' may include or be composed titanium, copper, and titanium, respectively.

Figure 9:
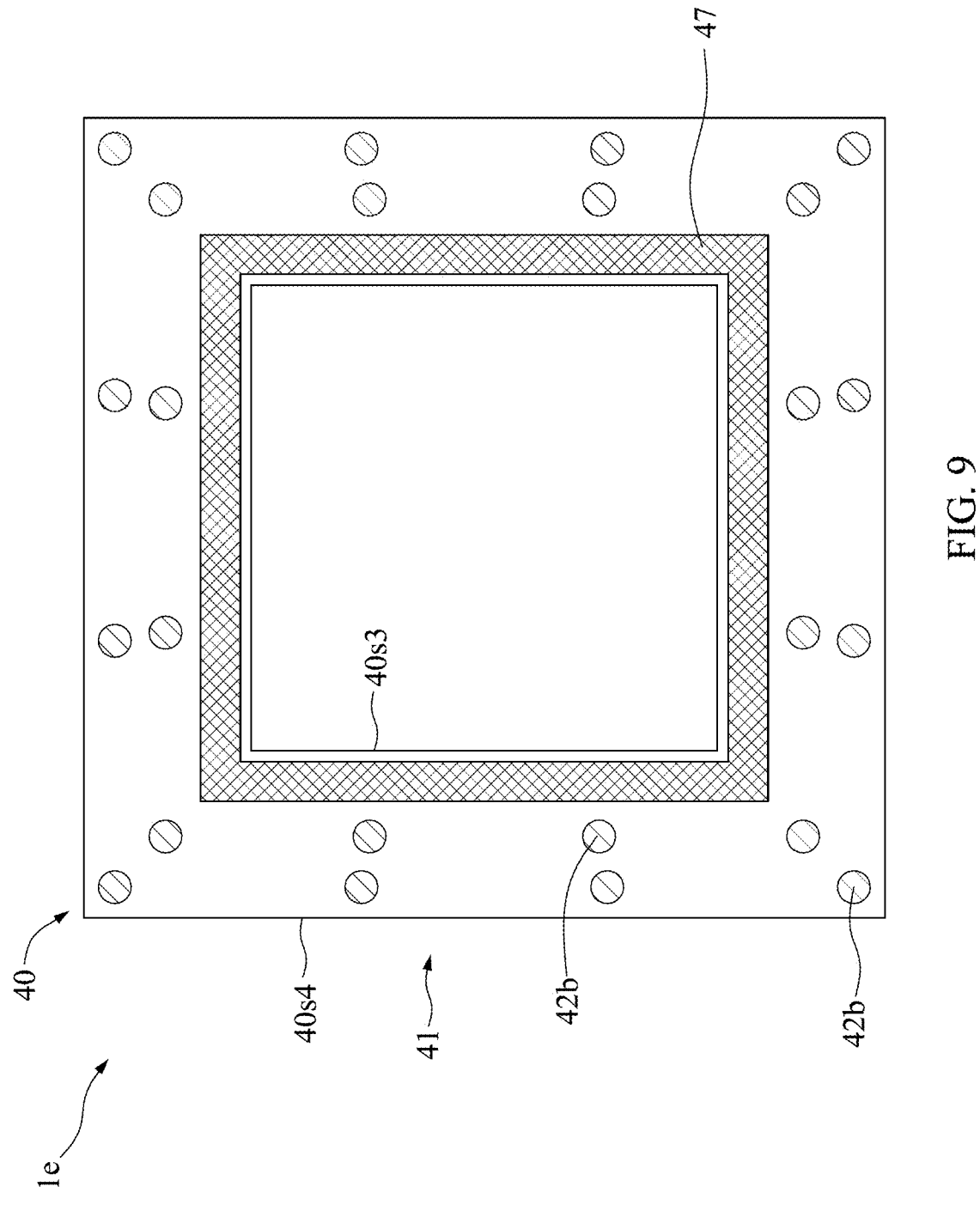
FIG. 9 illustrates a partial layout of a circuit structure, in accordance with an embodiment of the present disclosure.

FIG. 9 illustrates a partial layout of the circuit structure 40 of an electronic device 1*e*, in accordance with an embodiment of the present disclosure. The electronic device 1*e* is similar to the electronic device 1*a*, with differences therebetween as follows.

In some embodiments, the conductive elements 42*a* may be replaced with a conductive element 47. In some embodiments, the conductive element 47 may be embedded within the substrate 41 of the circuit structure 40. The conductive element 47 may be configured to receive or transmit a ground signal. In some embodiments, the conductive element 47 may include a ring-shaped profile. In some embodiments, the surface 40*s*3 may be completely spaced apart from the surface 40*s*4 by the conductive element 47 in a top view. In some embodiments, the conductive element 47 may define a completely closed ring, leading to an improvement of an EMI shielding performance.

Figure 10:
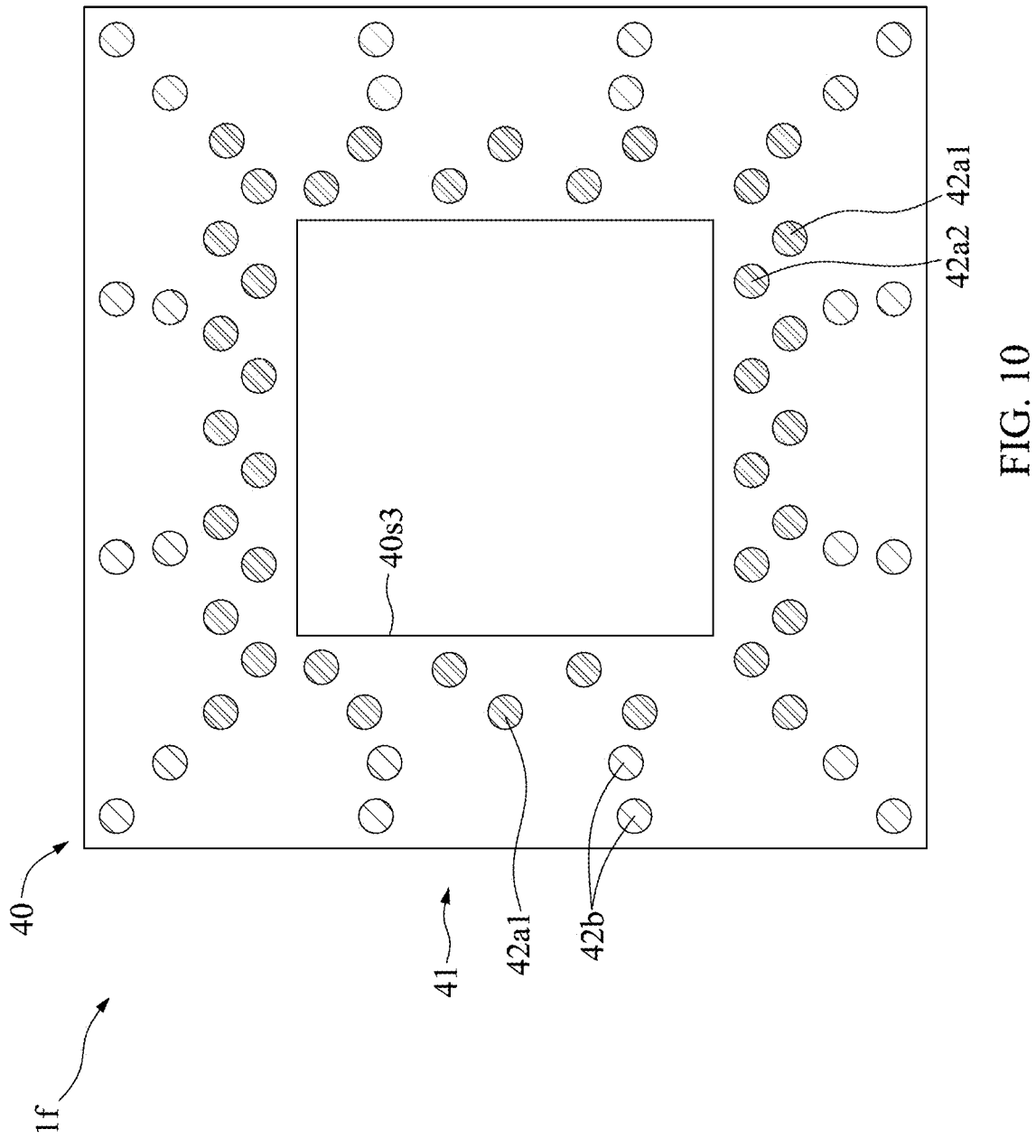
FIG. 10 illustrates a partial layout of a circuit structure, in accordance with an embodiment of the present disclosure.

FIG. 10 illustrates a partial layout of the circuit structure 40 of an electronic device 1*f*, in accordance with an embodiment of the present disclosure. The electronic device 1*f* is similar to the electronic device 1*a*, with differences therebetween as follows.

In some embodiments, the circuit structure 40 may include conductive elements 42*a*1 and conductive elements 42*a*2. In some embodiments, each of the conductive elements 42*a*1 and conductive elements 42*a*2 may be configured to receive or transmit a ground signal. The conductive elements 42*a*1 may surround the conductive elements 42*a*2. In some embodiments, the conductive elements 42*a*1 and conductive elements 42*a*2 may have a staggered arrangement. For example, the conductive elements 42*a*1 may be misaligned with the conductive elements 42*a*2 along a horizontal direction and a longitudinal direction. In some embodiments, the conductive element 42*a*2 is closer to the surface 40*s*3 than the conductive element 42*a*1 is. By such arrangements, EMI shielding performance is enhanced.

Figure 11:
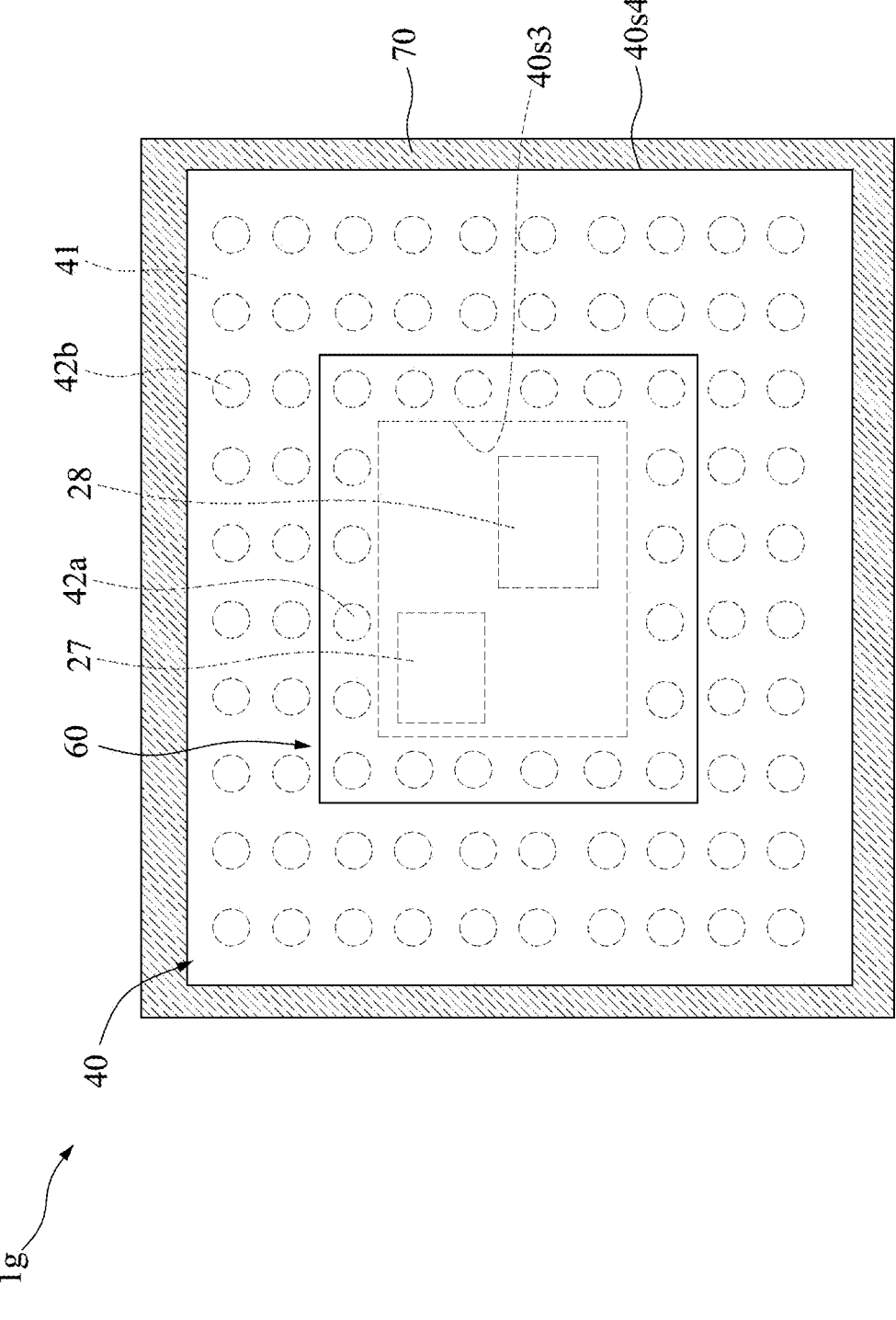
FIG. 11 illustrates a partial layout of a circuit structure, in accordance with an embodiment of the present disclosure.

FIG. 11 illustrates a partial layout of the circuit structure 40 of an electronic device 1*g*, in accordance with an embodiment of the present disclosure. The electronic device 1*g* is similar to the electronic device 1*a*, with differences therebetween as follows. It should be noted that some features are omitted for brevity in FIG. 11. For example, the terminals 44*a*, dielectric layer 43*a*, the substrate 41, and the encapsulant 52 are omitted, and the conductive elements 42*a* and 42*b* as well as the electronic components 27 and 28 are represented as dashed lines.

In some embodiments, the electronic device 1*g* may include electronic components 27 and 28. The electronic components 27 and 28 may be disposed below a circuit structure (e.g., the substrate 10 as shown in FIG. 1) and surrounded by the circuit structure 40. In some embodiments, the conductive elements 42*a* and conductive elements 42*b* may be aligned along a first direction (e.g., a horizontal direction) and a second direction (e.g., a longitudinal direction), which thereby forms an array arrangement. In some embodiments, the EMI shielding layer 60 may overlap the electronic components 27 and 28. In some embodiments, the EMI shielding layer 60 may overlap the conductive elements 42*a*. In some embodiments, the EMI shielding layer 60 may be free from overlapping the conductive elements 42*b*. In some embodiments, the EMI shielding layer 60 may have a rectangular profile, a square profile, or other suitable profile.

Figure 12:
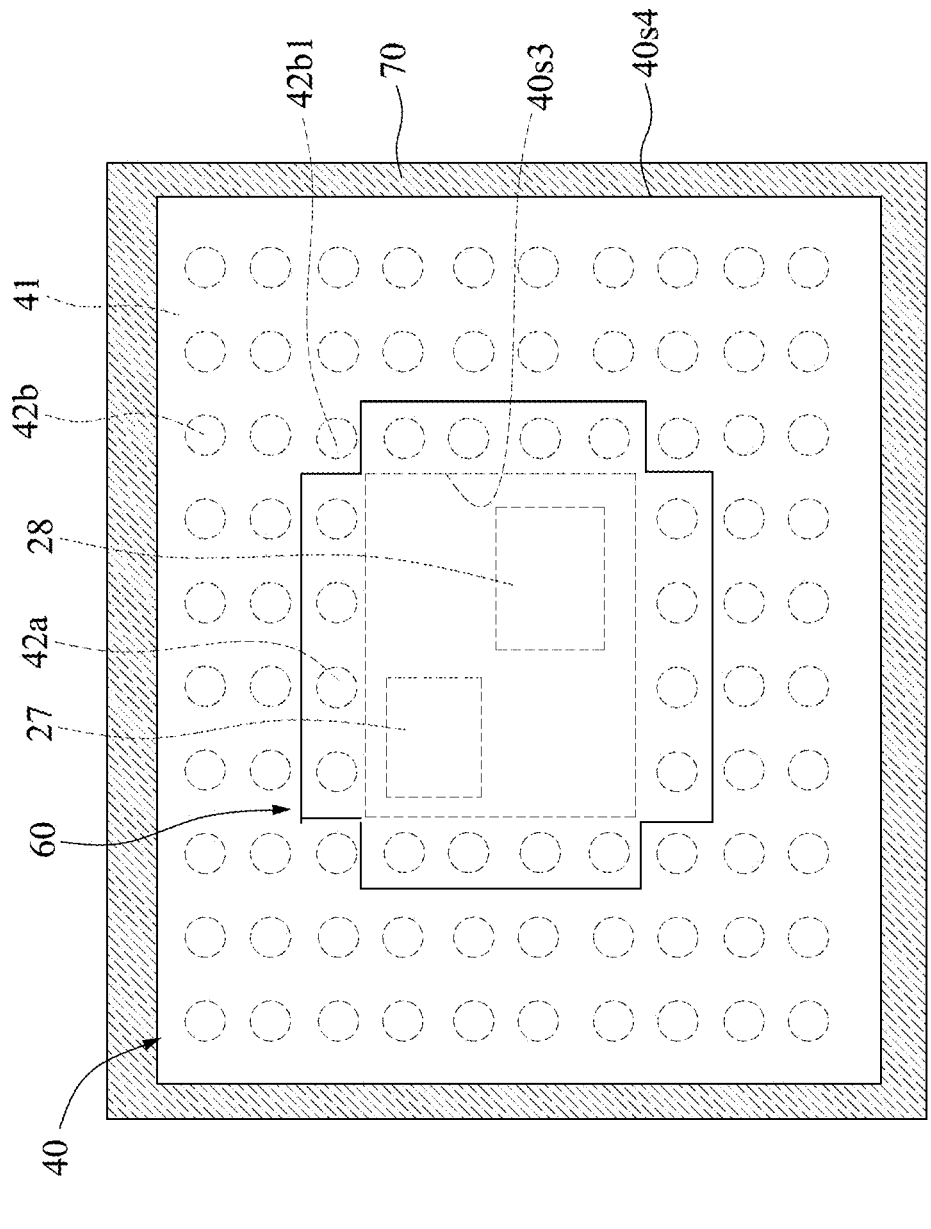
FIG. 12 illustrates a partial layout of a circuit structure, in accordance with an embodiment of the present disclosure.

FIG. 12 illustrates a partial layout of an electronic device 1*h*, in accordance with an embodiment of the present disclosure. The electronic device 1*h* is similar to the electronic device 1*a*, with differences therebetween as follows. It should be noted that some features are omitted for brevity in FIG. 12. For example, the terminals 44*a*, dielectric layer 43*a*, the substrate 41, and the encapsulant 52 are omitted, and the conductive elements 42*a* and 42*b* as well as the electronic components 27 and 28 are represented as dashed lines.

In some embodiments, the EMI shielding layer 60 may have a cross-shaped profile. In some embodiments, a portion of the conductive elements 42*b* (e.g., conductive element 42*b*1) may be aligned with the conductive elements 42*a* along both a first direction (e.g., a horizontal direction) and a second direction (e.g., a longitudinal direction).

Figure 13A:
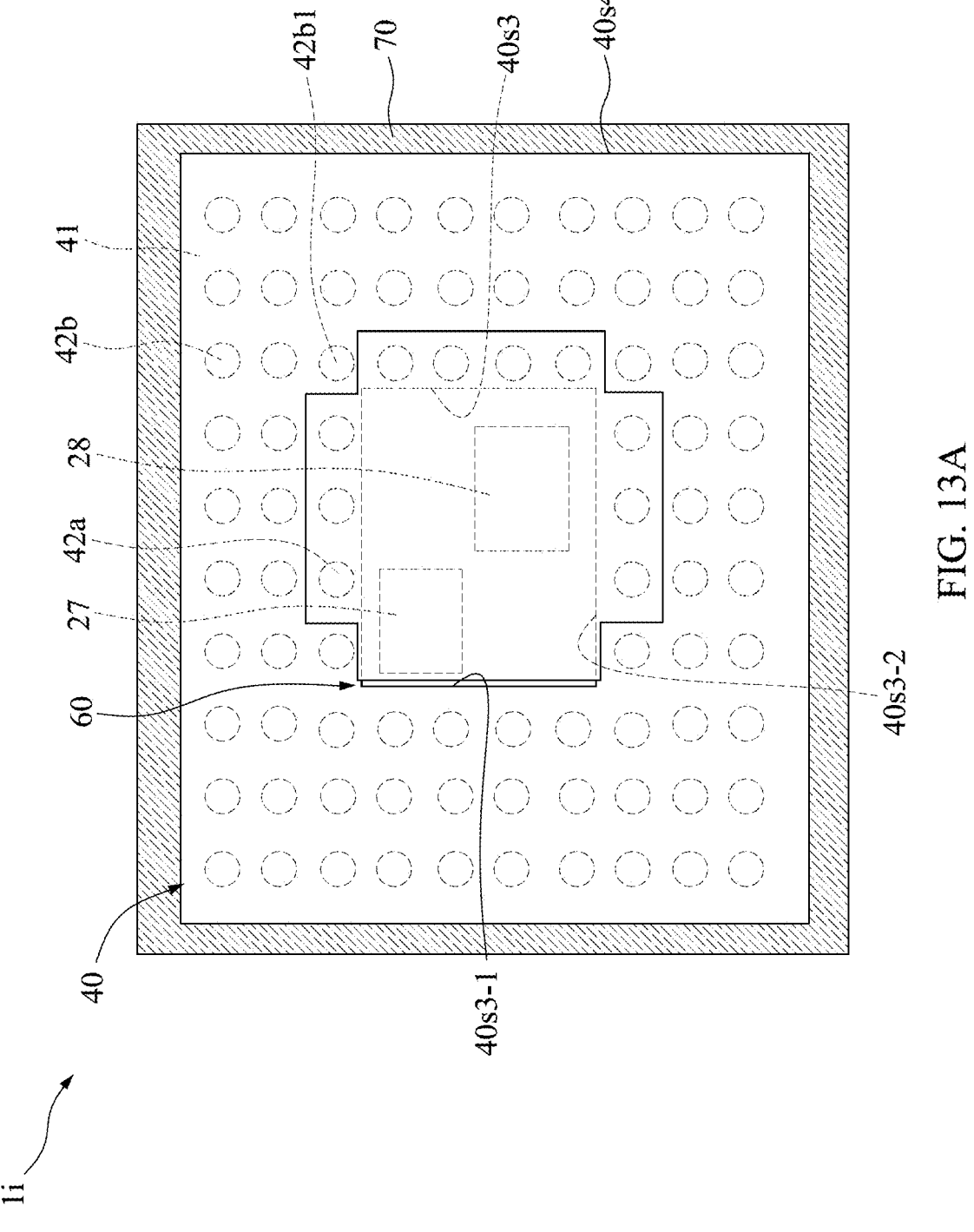
FIG. 13A illustrates a partial layout of a circuit structure, in accordance with an embodiment of the present disclosure.

FIG. 13A illustrates a partial layout of the circuit structure 40 of an electronic device 1*i*, in accordance with an embodiment of the present disclosure. The electronic device 1*i* is similar to the electronic device 1*a*, with differences therebetween as follows. It should be noted that some features are omitted for brevity in FIG. 13. For example, the terminals 44*a*, dielectric layer 43*a*, the substrate 41, and the encapsulant 52 are omitted, and the conductive elements 42*a* and 42*b* as well as the electronic components 27 and 28 are represented as dashed lines.

In some embodiments, no conductive element 42*a* is disposed at some of the sides of the surface 40*s*3. For example, the surface 40*s*3-1 only faces the conductive elements 42*b*. No conductive element 42*a* is disposed between the conductive element 42*b* and the surface 40*s*3-1. In some embodiments, some of the sides of the surface 40*s*3 may face both the conductive elements 42*a* and conductive elements 42*b*. For example, the surface 40*s*3-2 may face both the conductive elements 42*a* and conductive elements 42*b*. In some embodiments, the EMI shielding layer 60 may not encroach the surface 40*s*3-1 of the circuit structure 40 in a bottom or a top view.

In some conditions, the conductive elements 42*b* at the left side of the surface 40*s*3-1 of the circuit structure 40 may be configured to transmit a signal with a smaller frequency. Such smaller frequency may have a relatively small interference with the signals from the electronic components 27 and 28. In this case, the conductive elements 42*b* at the left side of the surface 40*s*3-1 of the circuit structure 40 may be free of being connected to the ground trace (e.g., 10*g*). As a result, the conductive elements 42*b* at the left side of the surface 40s3-1 may be connected to electrical connectors (e.g., soldering elements), which allows the circuit structures 40 to have more input/output terminals.

Figure 13B:
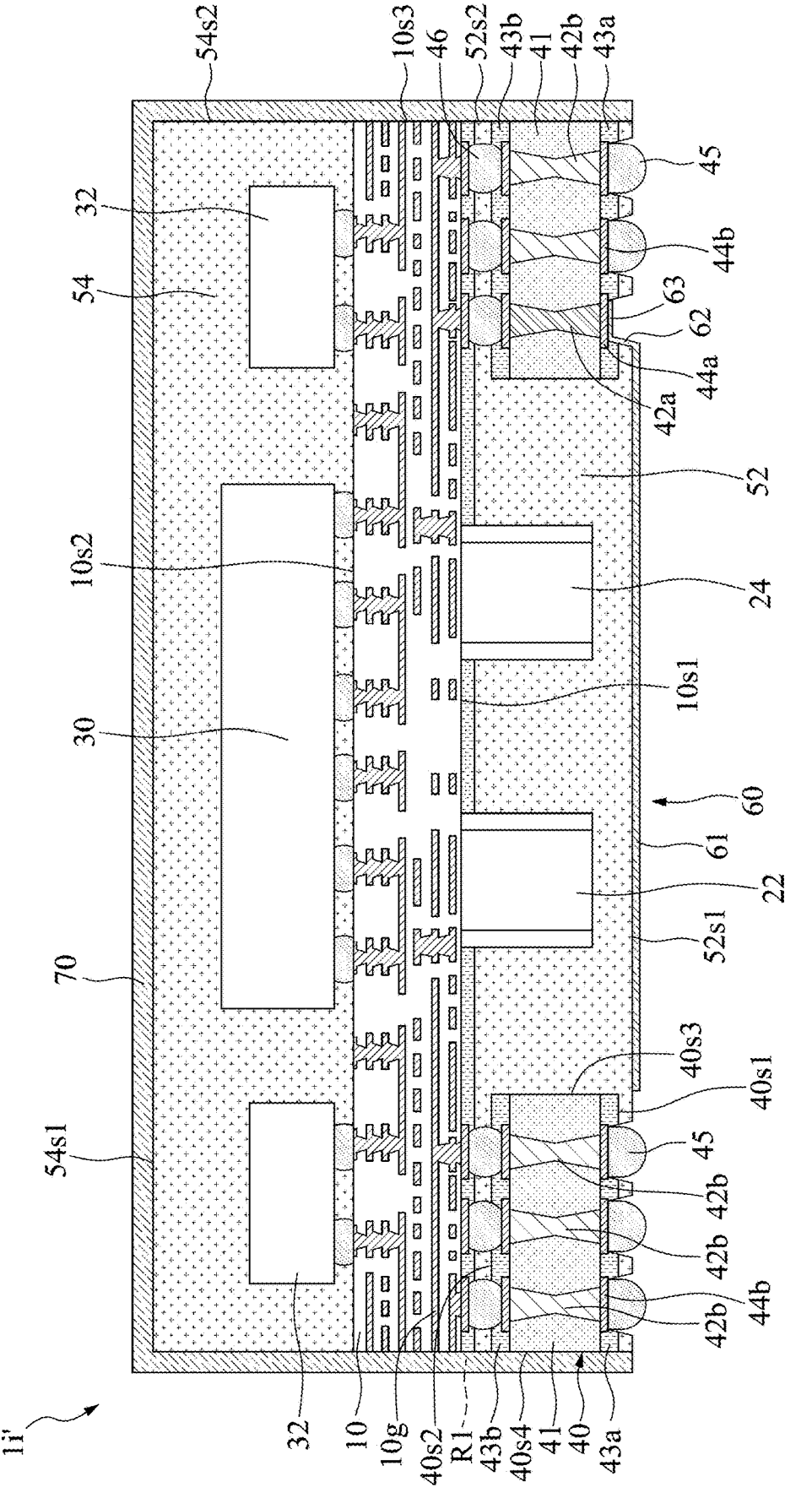
FIG. 13B is a cross-sectional view of an electronic device, in accordance with an embodiment of the present disclosure.

FIG. 13B is a cross-sectional view of an electronic device 1i′, in accordance with an embodiment of the present disclosure. The electronic device 1h is similar to the electronic device 1i′, with differences therebetween as follows.

In some embodiments, a portion of the conductive elements 42a may be replaced by the conductive element 42b. For example, the conductive elements 42a at the left side of FIG. 1 may be replaced by the conductive elements 42b. The electrical connector 45 may be connected to said conductive elements 42b and fill the recess 52r1 as shown in FIG. 3. In this embodiment, the quantity of the electrical connectors 45 at the left side of the circuit structure 40 may be different from that at the right side of the circuit structure 40.

Figure 14:
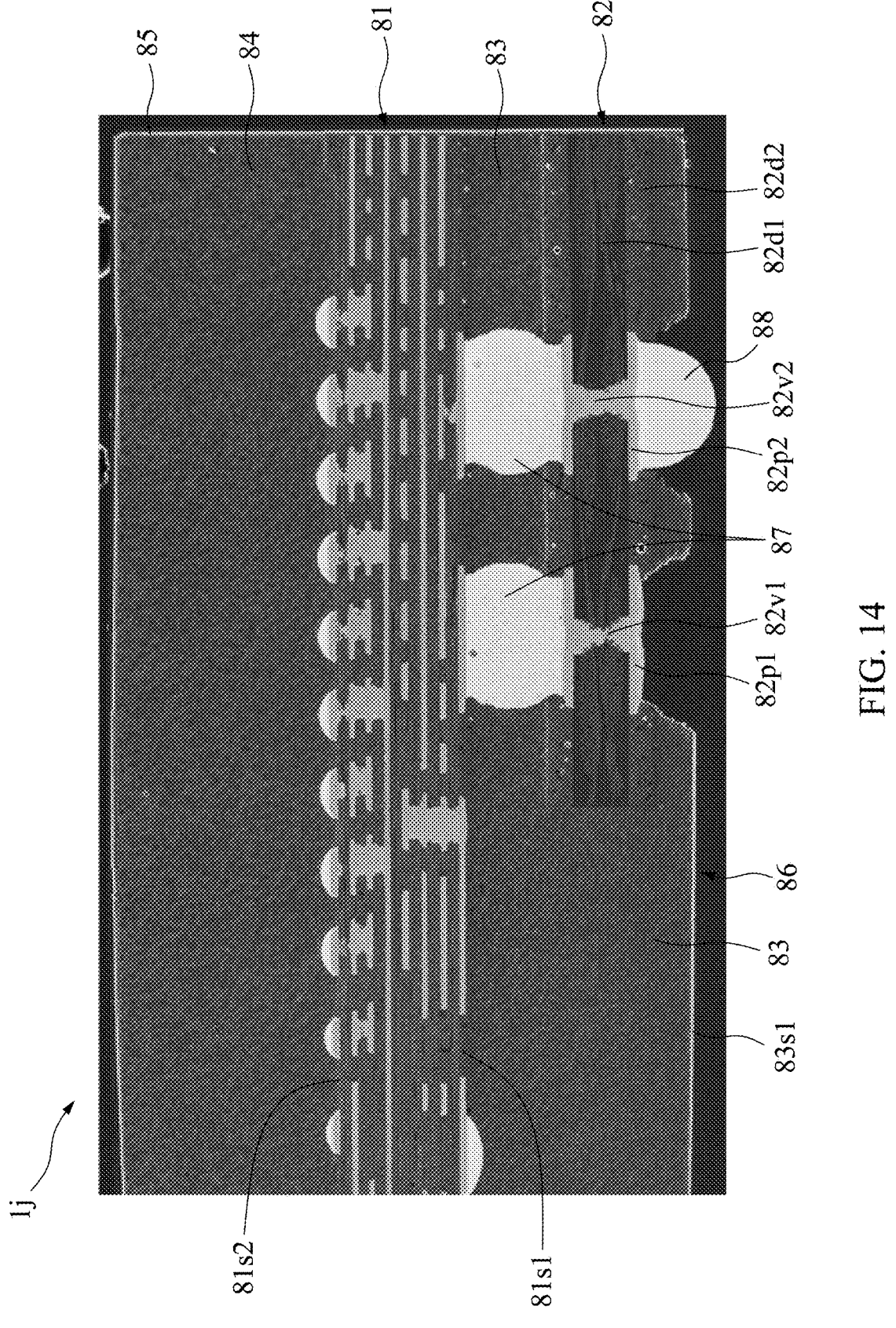
FIG. 14 is a cross-sectional view of an electronic device, in accordance with an embodiment of the present disclosure.

FIG. 14 is a partial cross-sectional view of an electronic device 1j, in accordance with an embodiment of the present disclosure.

The electronic device 1j shows a scanning electron microscope (SEM) image. In some embodiments, the electronic device 1j may include a circuit structure 81, a circuit structure 82, an encapsulant 83, an encapsulant 84, an EMI shielding layer 85, an EMI shielding layer 86, electrical connectors 87 and electrical connectors 88.

The circuit structure 81 may be or include, for example, a printed circuit board, such as a paper-based copper foil laminate, a composite copper foil laminate, or a polymer-impregnated glass-fiber-based copper foil laminate. The circuit structure 81 may have a surface 81s1 (or a lower surface) and a surface 81s2 (or an upper surface) opposite to the surface 81s1. The circuit structure 81 may include one or more transmission lines (e.g., communications cables) and one or more grounding lines and/or grounding planes. For example, the circuit structure 81 may include one or more conductive pads in proximity to, adjacent to, or embedded in and exposed by the surface 81s1 and/or the surface 81s2 of the circuit structure 81.

In some embodiments, the circuit structure 82 may be disposed on or below the surface 81s1 of the circuit structure 81. In some embodiments, the circuit structure 82 may disposed at a peripheral region of the circuit structure 81. In some embodiments, the circuit structure 82 may include a substrate 82d1, a dielectric layer 82d2, a conductive element 82v1, a conductive element 82v2, a terminal 82p1, and a terminal 82p2.

The substrate 82d1 may encapsulate the conductive element 82v1 and conductive element 82v2. The substrate 82d1 may include or be composed of multiple dielectric layers. The substrate 82d1 may include, for example, polyimide, polyimide-isoindoloquinazolinedione, polybenzoxazole, benzocyclobutene, or other suitable materials.

In some embodiments, the conductive element 82v1 may be disposed within the substrate 82d1 of the circuit structure 82. In some embodiments, the conductive element 82v1 may be electrically connected to ground or be configured to transmit a ground signal, leading to a decrease of EMI interference between the conductive element 82v2 and an electronic component (not shown).

The conductive element 82v2 may be disposed within the substrate 82d1 of the circuit structure 82. In some embodiments, the conductive element 82v2 may be configured to transmit a non-ground signal, such as an I/O signal.

In some embodiments, each of the conductive element 82v1 and the conductive element 82v2 may include a seed layer (not annotated) and a conductive material (not annotated). The seed layer may include titanium, titanium nitride, or other suitable materials. The conductive material may include copper, silver, aluminum, or other suitable materials. In some embodiments, the conductive element 82v1 and/or 82v2 may have an X-shaped profile. For example, the conductive element 82v1 and/or 82v2 have an upper portion and a lower portion tapered toward each other. The upper portion and the lower portion may be formed by individual laser drilling steps.

The dielectric layer 82d2 may cover the substrate 82d1. The dielectric layer 82d2 may include a solder resist, which defines a space exposing terminal 82p1 and terminal 82p2.

The terminal 82p1 may be electrically connected to the conductive element 82v1. The terminal 82p2 may be electrically connected to the conductive element 82v2.

In some embodiments, the encapsulant 83 may be disposed on or below the surface 81s1 of the circuit structure 81. The encapsulant 83 may cover the upper surface and lower surface (not annotated) of the circuit structure 82. The encapsulant 83 may include a novolac-based resin, an epoxy-based resin, a silicone-based resin, or another suitable material. Suitable fillers may also be included, such as powdered $SiO_2$. The encapsulant 83 may have a surface 83s1 (or a lower surface). In some embodiments, the electrical connector 88 may be exposed by the surface 83s1 of the encapsulant 83.

In some embodiments, the encapsulant 84 may be disposed on or over the surface 81s2 of the circuit structure 81. The encapsulant 84 may be spaced apart from the encapsulant 83 by the circuit structure 81. The encapsulant 84 may include a novolac-based resin, an epoxy-based resin, a silicone-based resin, or another suitable material. Suitable fillers may also be included, such as powdered $SiO_2$.

In some embodiments, the EMI shielding layer 85 may cover the encapsulant 84. The EMI shielding layer 85 may cover the lateral surface (not annotated) of the circuit structure 81. The EMI shielding layer 85 may cover the lateral surface (not annotated) of the circuit structure 82. The EMI shielding layer 85 may cover the lateral surface (not annotated) of the encapsulant 83. The EMI shielding layer 85 may cover the lateral surface (not annotated) of the encapsulant 84.

In some embodiments, the EMI shielding layer 86 may be disposed on or below the surface 81s1 of the circuit structure 81. In some embodiments, the EMI shielding layer 86 may be electrically connected to ground. In some embodiments, the EMI shielding layer 86 may be electrically connected to the conductive element 82v1 of the circuit structure 82 through the terminal 82p1. In some embodiments, the EMI shielding layer 86 may be electrically isolated from the conductive element 82v2 of the circuit structure 82.

The electrical connector 87 may be electrically connected between the conductive element 82v1 (or conductive element 82v2) and the circuit structure 81. The electrical connector 88 may be electrically connected to the conductive element 82v2. Each of the electrical connector 87 and electrical connector 88 may include a solder material, such as alloys of gold and tin solder or alloys of silver and tin solder. In some embodiments, the terminal 82p1 may be free of solder-joints. In some embodiments, a conductive structure including the conductive element 82v1 and terminal 82p1 is free of solder-joints at a side far from the circuit structure 81.

Figure 15:
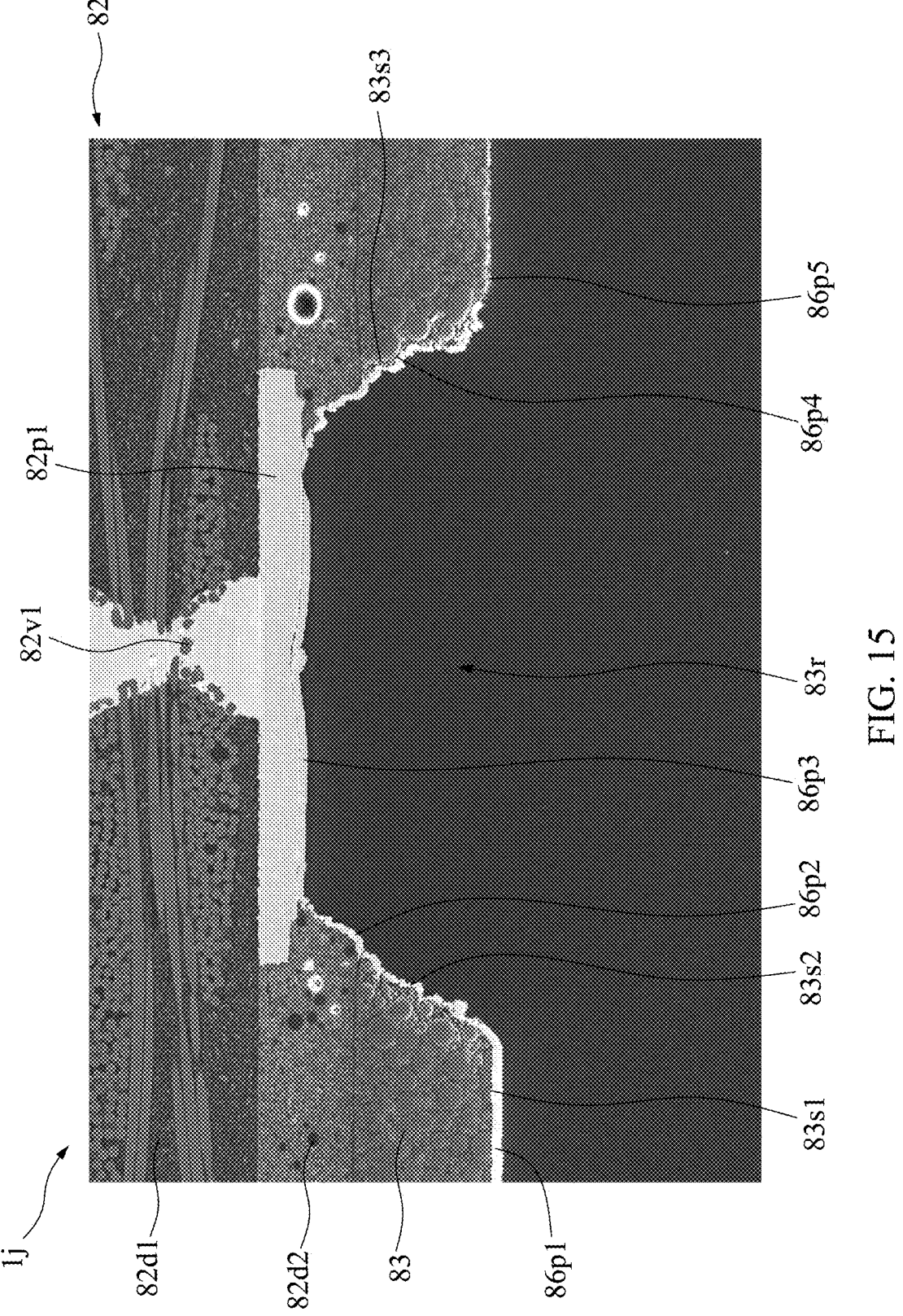
FIG. 15 illustrates a partial enlarged view of the electronic device as shown in FIG. 14, in accordance with an embodiment of the present disclosure.

Referring to FIG. 15, FIG. 15 illustrates a partial enlarged view of FIG. 14. In some embodiments, the encapsulant 83 may define a recess 83r exposing the terminal 82p1. The encapsulant 83 may have surfaces 83s2 and 83s3 serving as a side of the recess 83r. In some embodiments, the recess 83$r$ may be free of solder elements or solder material(s). In some embodiments, a roughness of the surface 83$s$2 may be greater than that of the surface 83$s$1. In some embodiments, the outer surface (or lower surface) of the portion 86$p$3 may have a roughness less than that of the outer surface (or lateral surface) of the portion 86$p$2 (or 86$p$4). In some embodiments, the outer surface (or lower surface) of the portion 86$p$1 (or 86$p$5) may have a roughness less than that of the outer surface (or lateral surface) of the portion 86$p$2 (or 86$p$4).

In some embodiments, the EMI shielding layer 86 may include portions 86$p$1, 86$p$2, 86$p$3, 86$p$4, and 86$p$5. The portion 86$p$1 may be disposed on or below the surface 83$s$1 of the encapsulant 83. In some embodiments, the portion 86$p$1 may be in contact with the encapsulant 83. In some embodiments, the portion 86$p$2 may be disposed on the surface 83$s$2 of the encapsulant 83. In some embodiments, the portion 86$p$2 may be disposed within the recess 83$r$ of the encapsulant 83. In some embodiments, the portion 86$p$3 may be in contact with the terminal 82$p$1. In some embodiments, the portion 86$p$3 may be disposed within the recess 83$r$. In some embodiments, the portion 86$p$3 may be spaced apart from the encapsulant 83. The portion 86$p$2 may connect the portions 86$p$1 and 86$p$3. The portion 86$p$4 may be disposed on the surface 83$s$3 of the encapsulant 83. The portion 86$p$5 may be disposed on or below the surface 83$s$1 of the encapsulant 83. The portion 86$p$4 may connect the portions 86$p$3 and 86$p$5. In some embodiments, the thickness of the portion 86$p$1 may be greater than that of the portion 86$p$2. In some embodiments, the thickness of the portion 86$p$1 may be greater than that of the portion 86$p$3.

FIG. 16A, FIG. 16B, FIG. 17, FIG. 18, FIG. 19, FIG. 20, FIG. 21, FIG. 22, FIG. 23, and FIG. 24 illustrate one or more stages of an example of a method for manufacturing an electronic device according to some embodiments of the present disclosure.

Figure 16A:
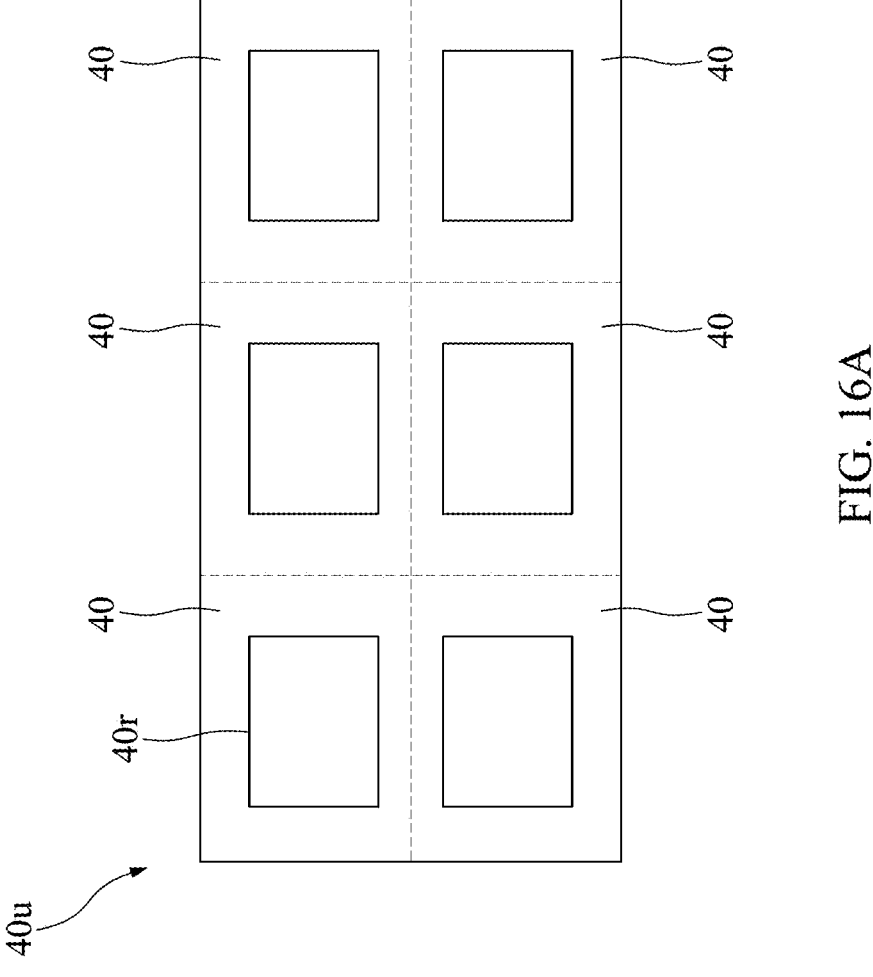
FIG. 16A and FIG. 16B illustrate one or more stages of an example of a method for manufacturing an electronic device according to some embodiments of the present disclosure.

Referring to FIG. 16A, FIG. 16A illustrate a top view of a core carrier 40$u$. The core carrier 40$u$ may include a plurality of circuit structures 40 constituting repeated units, which will be singulated later. Each of the circuit structures 40 may include an opening 40$r$. FIGS. 16B to 24 illustrate cross-sectional views of one of repeated units at different stages. That is, the circuit structure 40 may be a ring-shaped interposer or have other suitable profiles. In some embodiments, a package unit may include multiple interposers spaced apart from each other, depending on the requirements of the quantity of I/O terminals and the requirements of the EMI shielding.

Figure 16B:
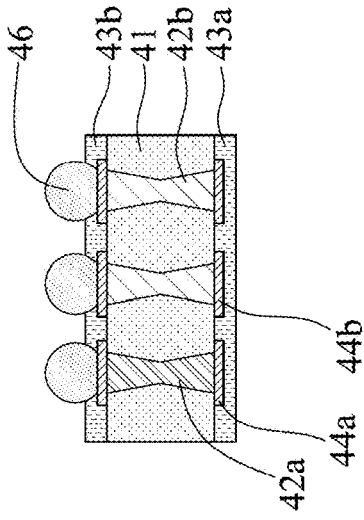
Figure 16B:
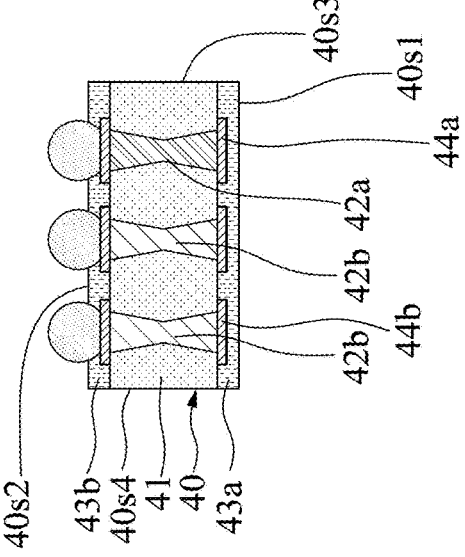

Referring to FIG. 16B, the conductive elements 42$a$ and conductive elements 42$b$ may be formed within the substrate 41. The dielectric layers 43 and 43$b$ may be formed to cover the surface 40$s$1 and surface 40$s$2 of the circuit structure 40. The electrical connectors 46 may be formed on or over the surface 40$s$2 of the circuit structure 40.

Figure 17:
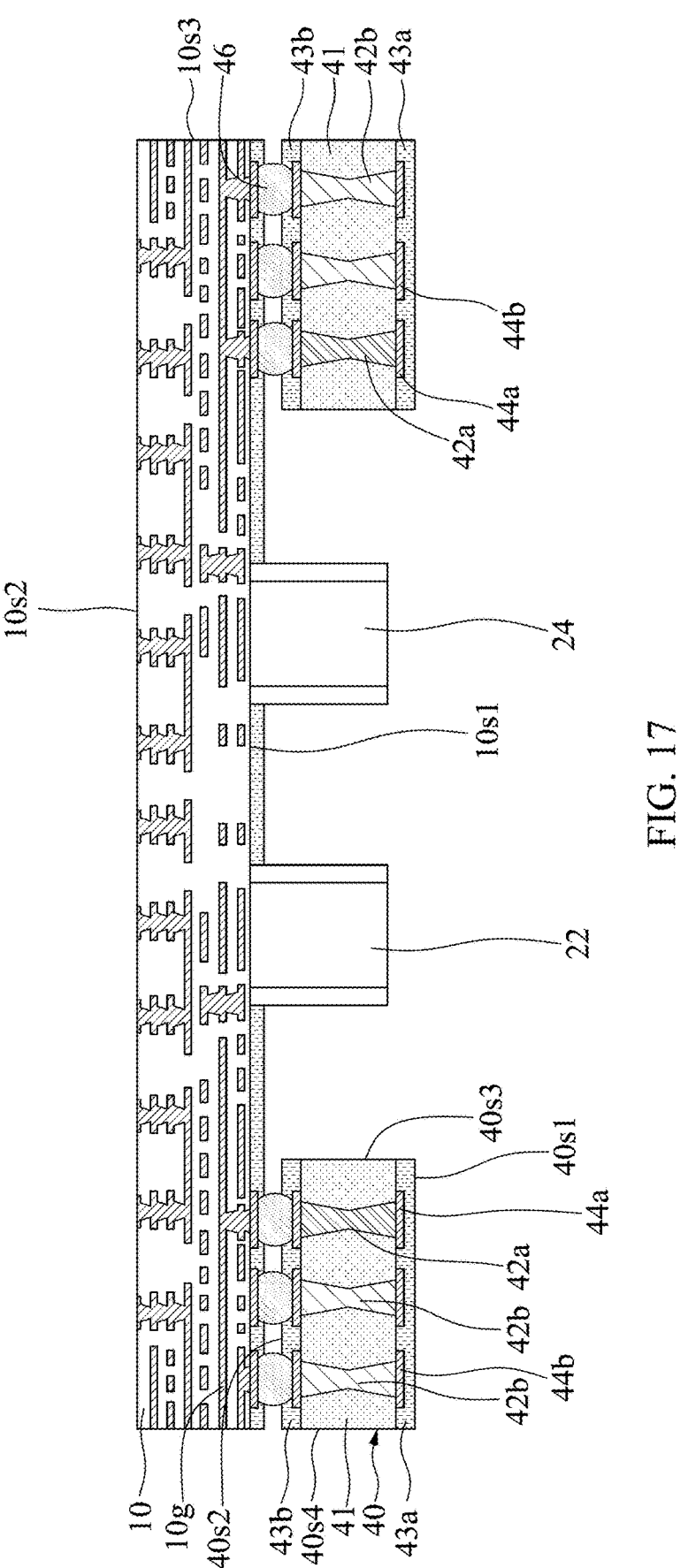
FIG. 17 illustrates one or more stages of an example of a method for manufacturing an electronic device according to some embodiments of the present disclosure.

Referring to FIG. 17, the substrate 10 may be provided. The substrate 10 may be attached to the circuit structure 40 (or core carrier 40$u$) through the electrical connectors 46. The electronic components 22 and 24 may be attached to the surface 10$s$1 of the substrate 10.

Figure 18:
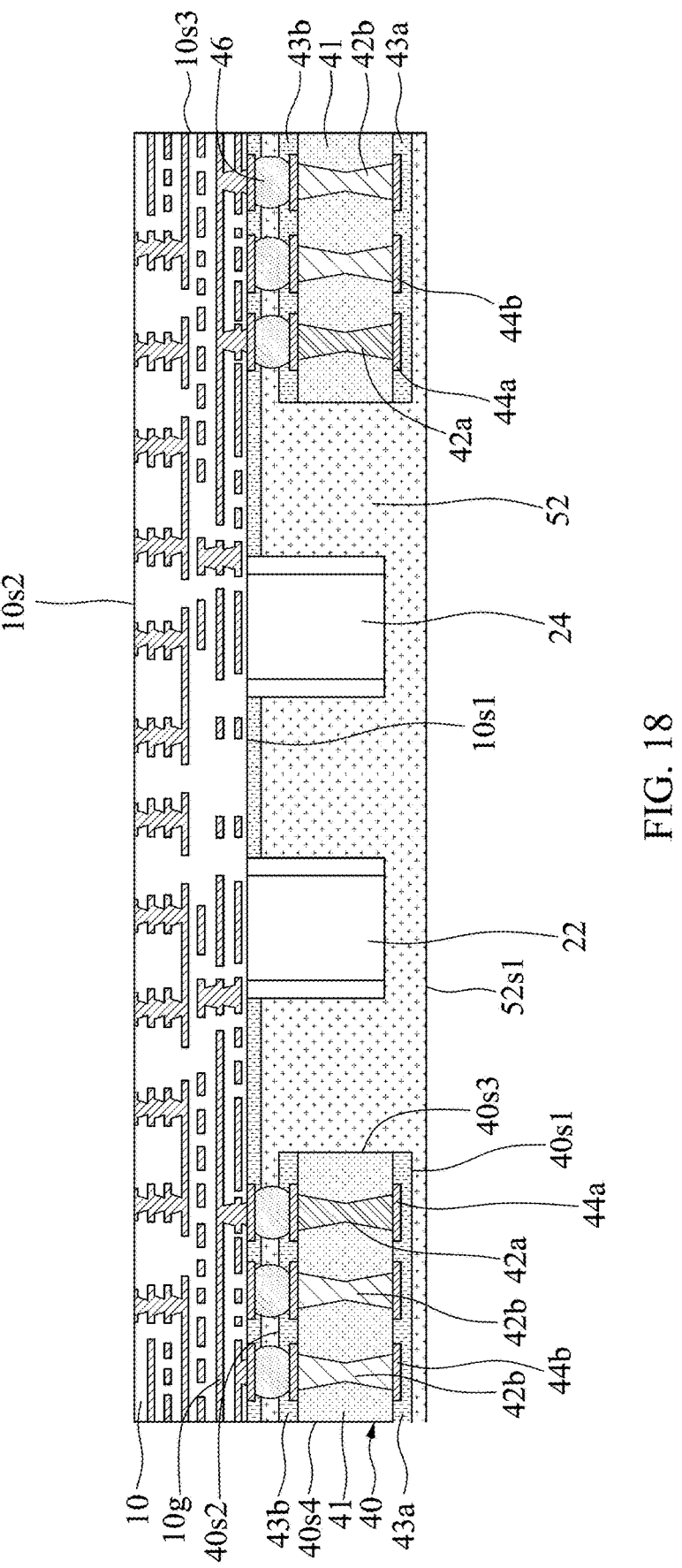
FIG. 18 illustrates one or more stages of an example of a method for manufacturing an electronic device according to some embodiments of the present disclosure.

Referring to FIG. 18, the encapsulant 52 may be formed on or below the surface 10$s$1 of the substrate 10. The electronic components 22 and 24 may be encapsulated by the encapsulant 52. The encapsulant 52 may cover the surface 40$s$1 of the circuit structure 40.

Figure 19:
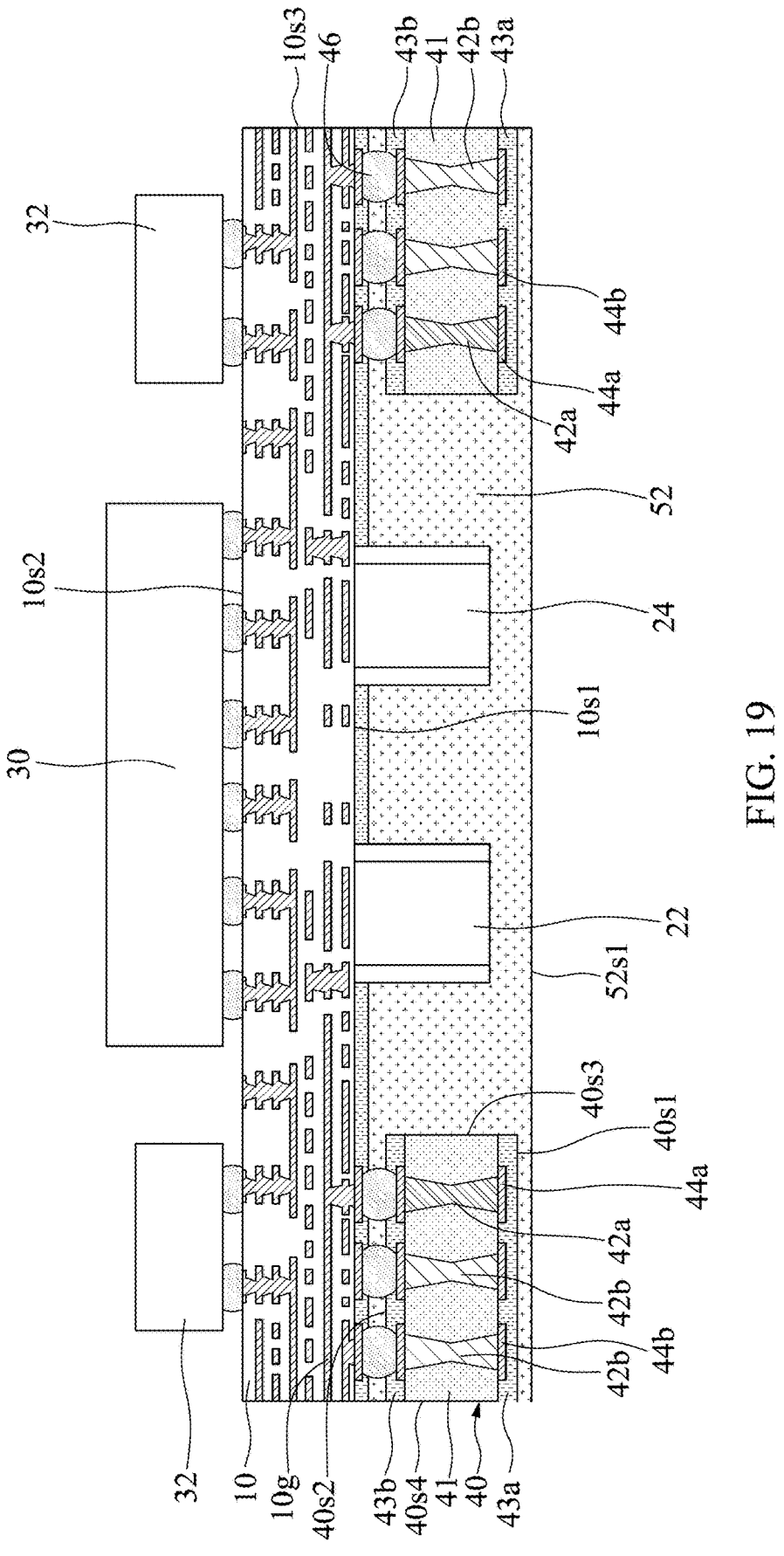
FIG. 19 illustrates one or more stages of an example of a method for manufacturing an electronic device according to some embodiments of the present disclosure.

Referring to FIG. 19, the electronic component 30 may be attached to the surface 10$s$2 of the substrate 10. In some embodiments, the electronic component 30 may be attached to the substrate 10 by, for example, a flip chip technique or other suitable techniques.

Figure 20:
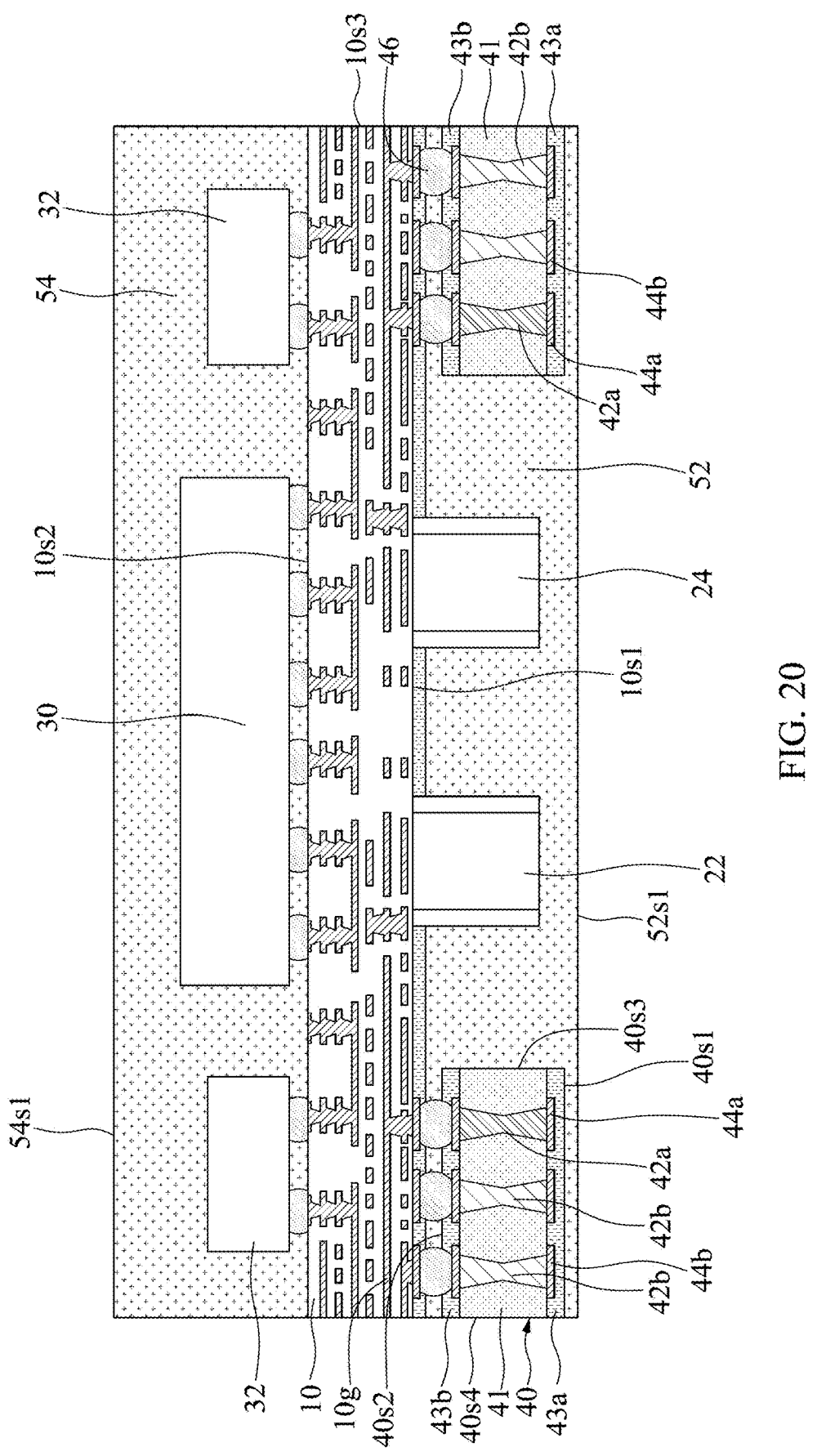
FIG. 20 illustrates one or more stages of an example of a method for manufacturing an electronic device according to some embodiments of the present disclosure.

Referring to FIG. 20, the encapsulant 54 may be formed on or over the surface 10$s$2 of the substrate 10. The encapsulant 54 may encapsulate the electronic component 30.

Figure 21:
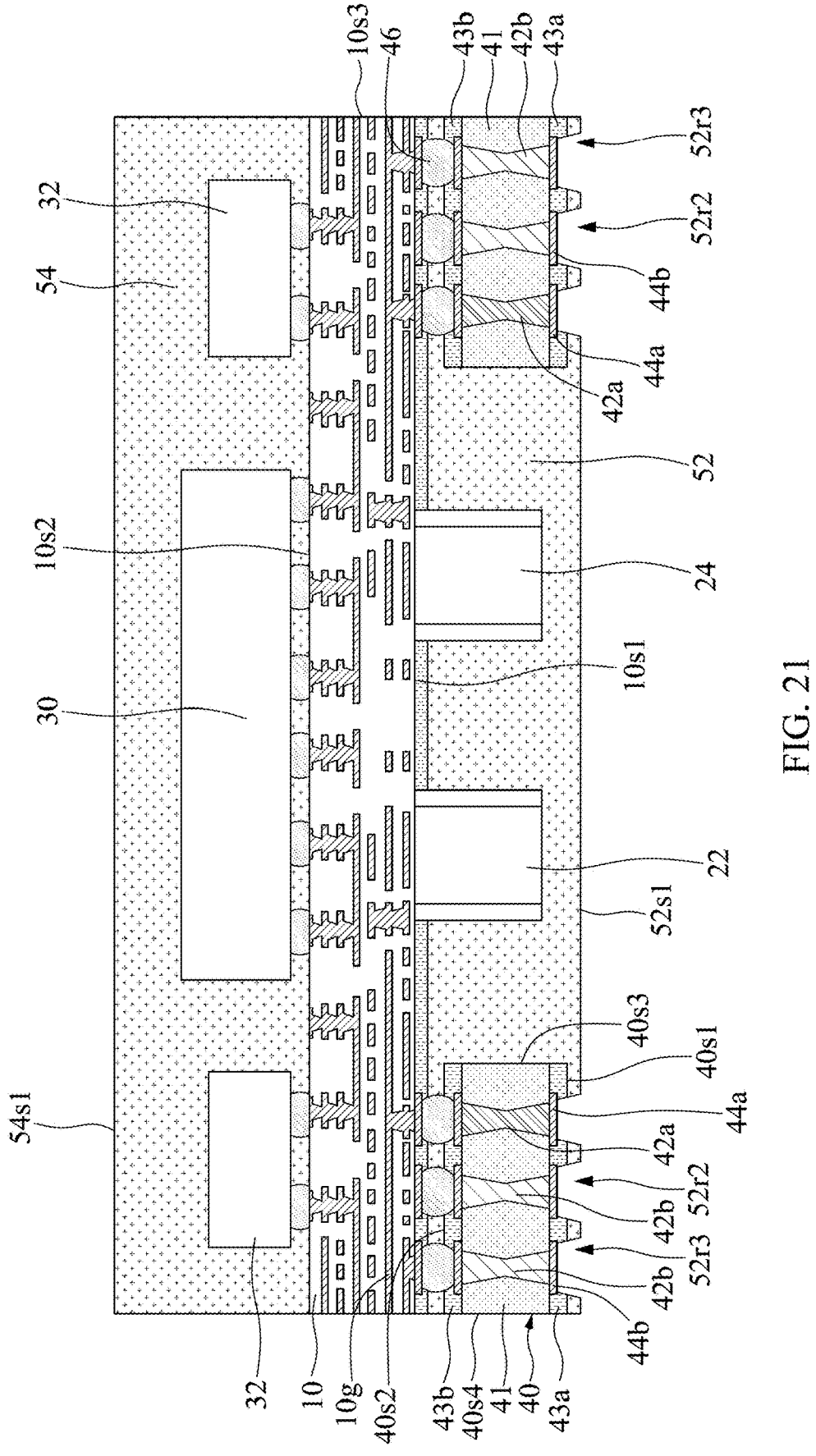
FIG. 21 illustrates one or more stages of an example of a method for manufacturing an electronic device according to some embodiments of the present disclosure.

Referring to FIG. 21, a portion of the dielectric layer 43$a$ and the encapsulant 52 may be removed. The conductive elements 42$a$ and conductive elements 42$b$ may be exposed. In some embodiments, the dielectric layer 43$a$ and encapsulant 52 may be removed by, for example, a laser ablation technique or other suitable techniques.

Figure 22:
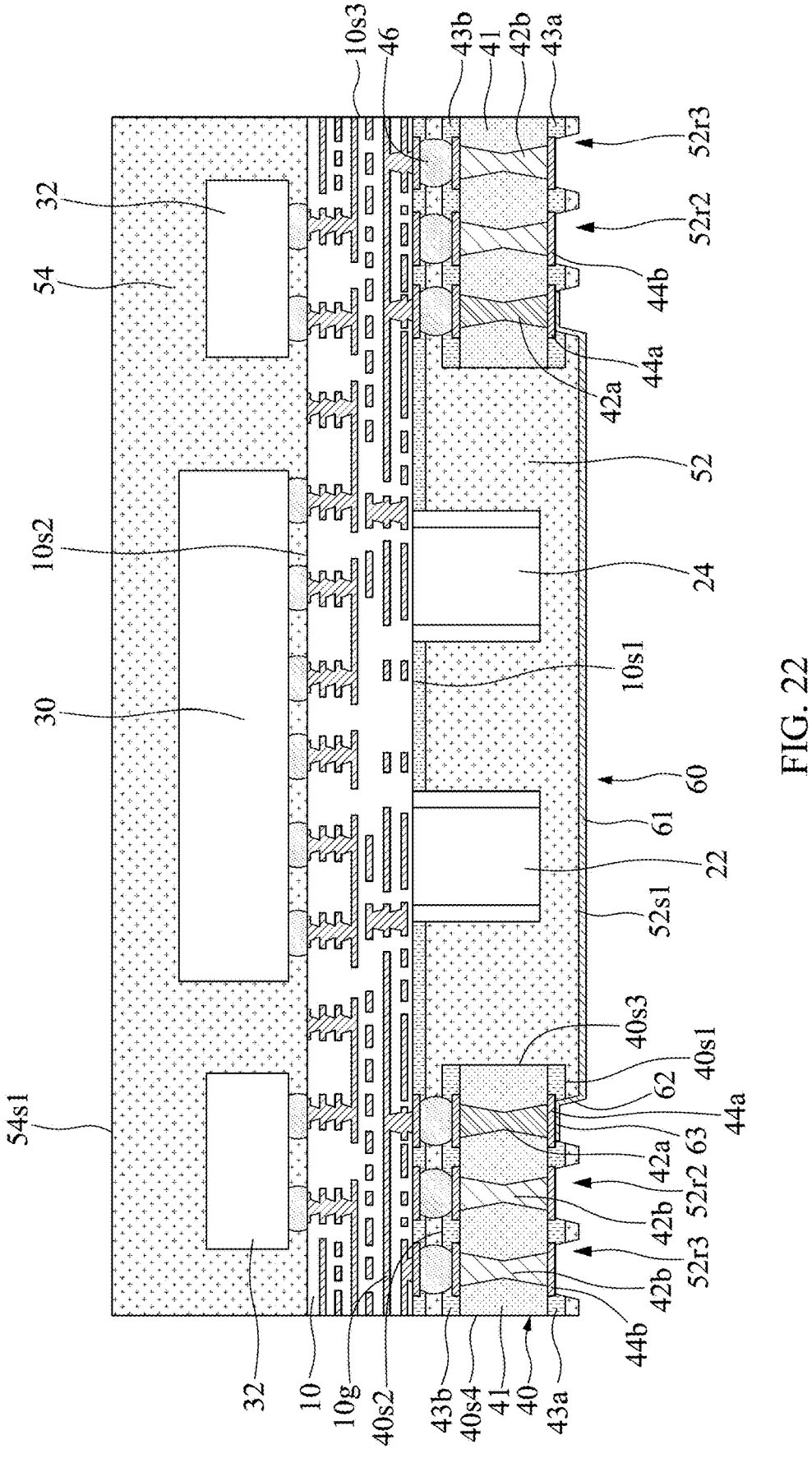
FIG. 22 illustrates one or more stages of an example of a method for manufacturing an electronic device according to some embodiments of the present disclosure.

Referring to FIG. 22, the EMI shielding layer 60 may be formed to cover a portion of the surface 52$s$1 of the encapsulant 52. The EMI shielding layer 60 may be electrically connected to the conductive element 42$a$. In some embodiments, a mask (not shown) may be utilized to define the pattern of the EMI shielding layer 60. In some embodiments, the EMI shielding layer 60 may be formed by, for example, physical vapor deposition (PVD), chemical vapor deposition (CVD), or other suitable processes. For example, the EMI shielding layer 60 may be formed by a sputter technique.

Figure 23:
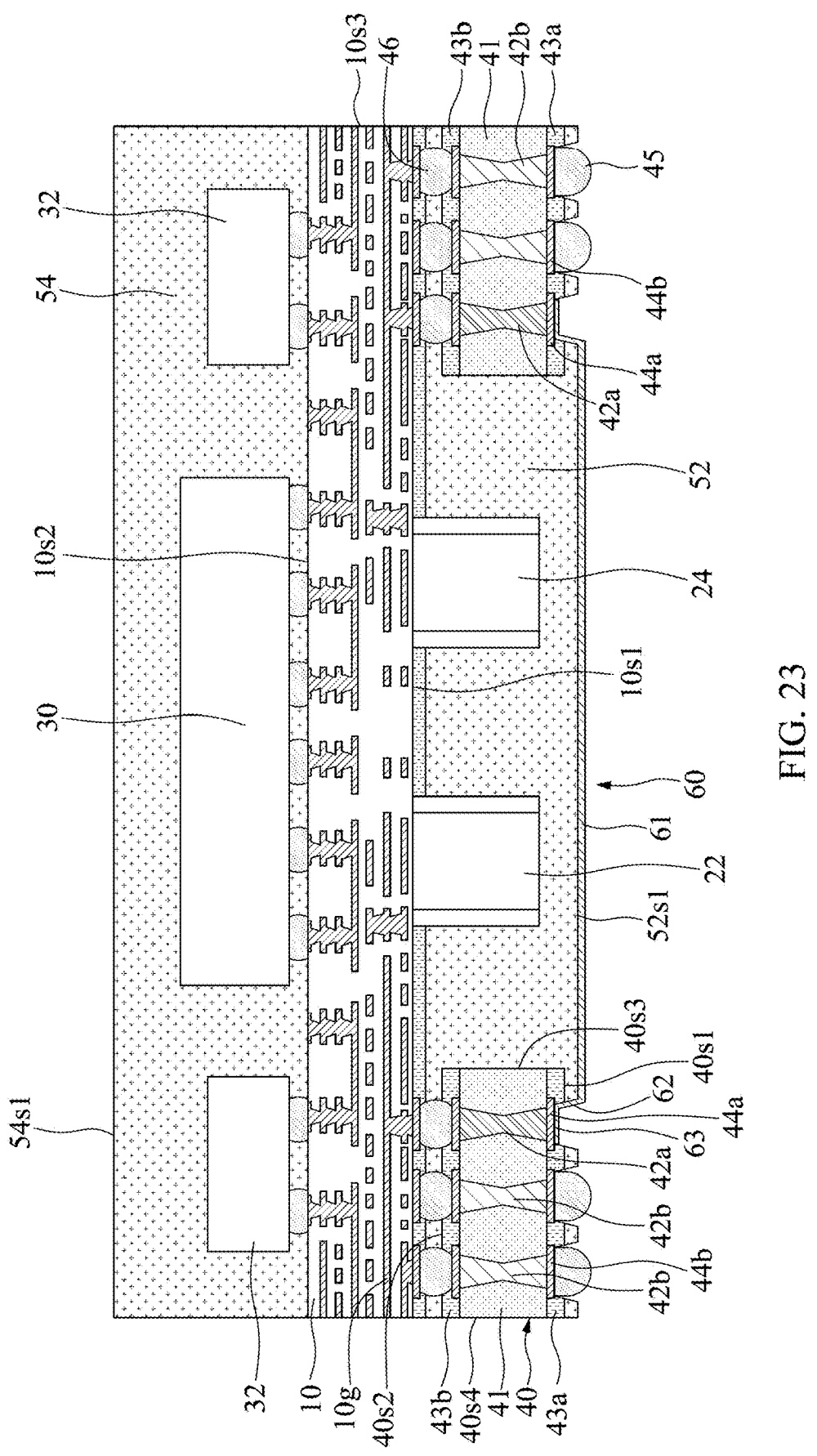
FIG. 23 illustrates one or more stages of an example of a method for manufacturing an electronic device according to some embodiments of the present disclosure.

Referring to FIG. 23, the electrical connectors 45 may be formed on or below the conductive elements 42$b$.

Figure 24:
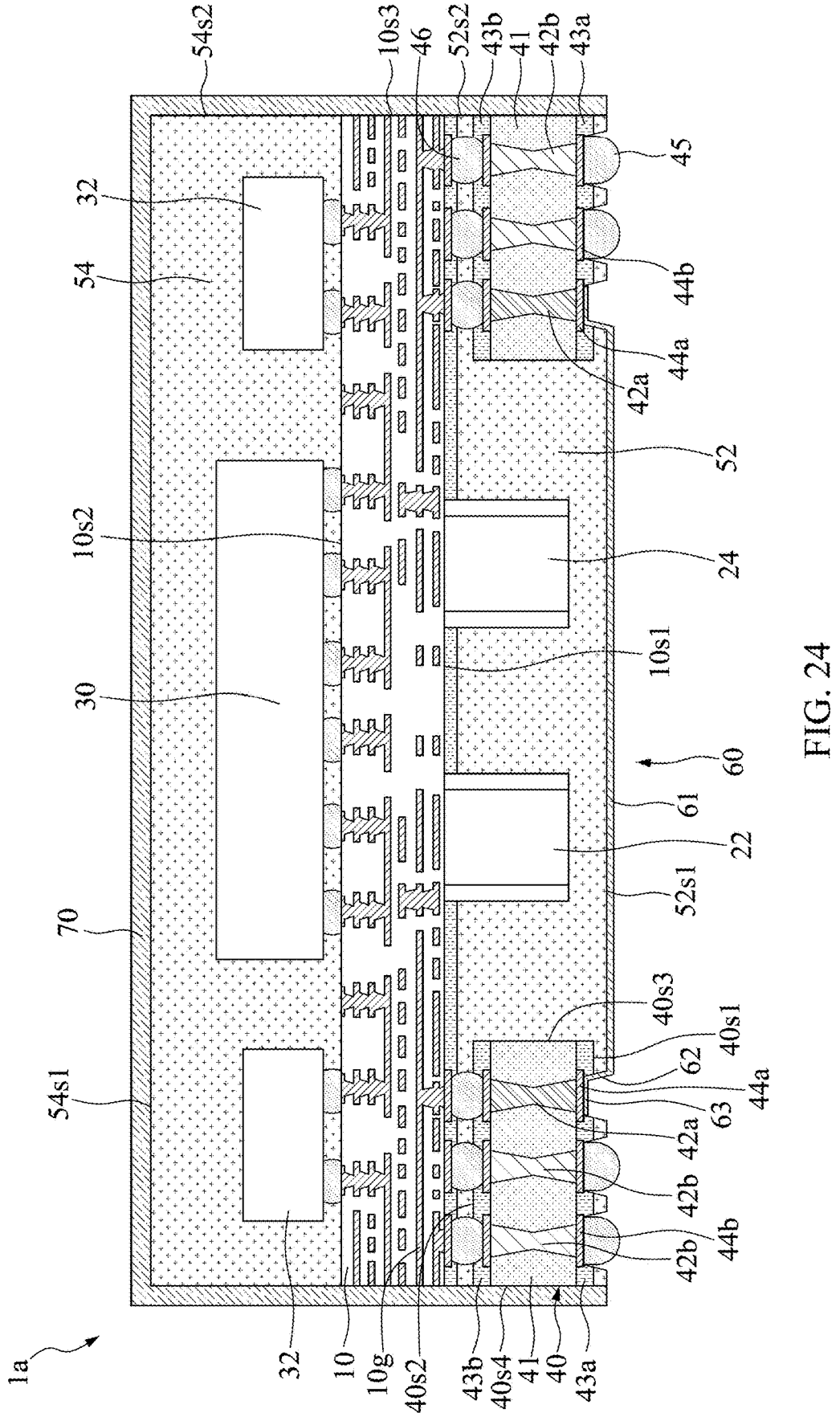
FIG. 24 illustrates one or more stages of an example of a method for manufacturing an electronic device according to some embodiments of the present disclosure.

Referring to FIG. 24, the core carrier 40$u$, as shown in FIG. 16A, may be sawed to separate multiple the circuit structures 40. In some embodiments, the substrate 10, the encapsulant 52, and the encapsulant 54 may be sawed to define the surface 10$s$3, the surface 52$s$2, and the surface 54$s$2. Further, an EMI shielding layer 70 may be formed to cover the surface 54$s$1 and surface 54$s$2 of the encapsulant 54, the surface 10$s$3 of the substrate 10, and the surface 52$s$2 of the encapsulant 52. As a result, an electronic device (e.g., an electronic device 1$a$ as shown in FIG. 1) may be produced.

Figure 25:
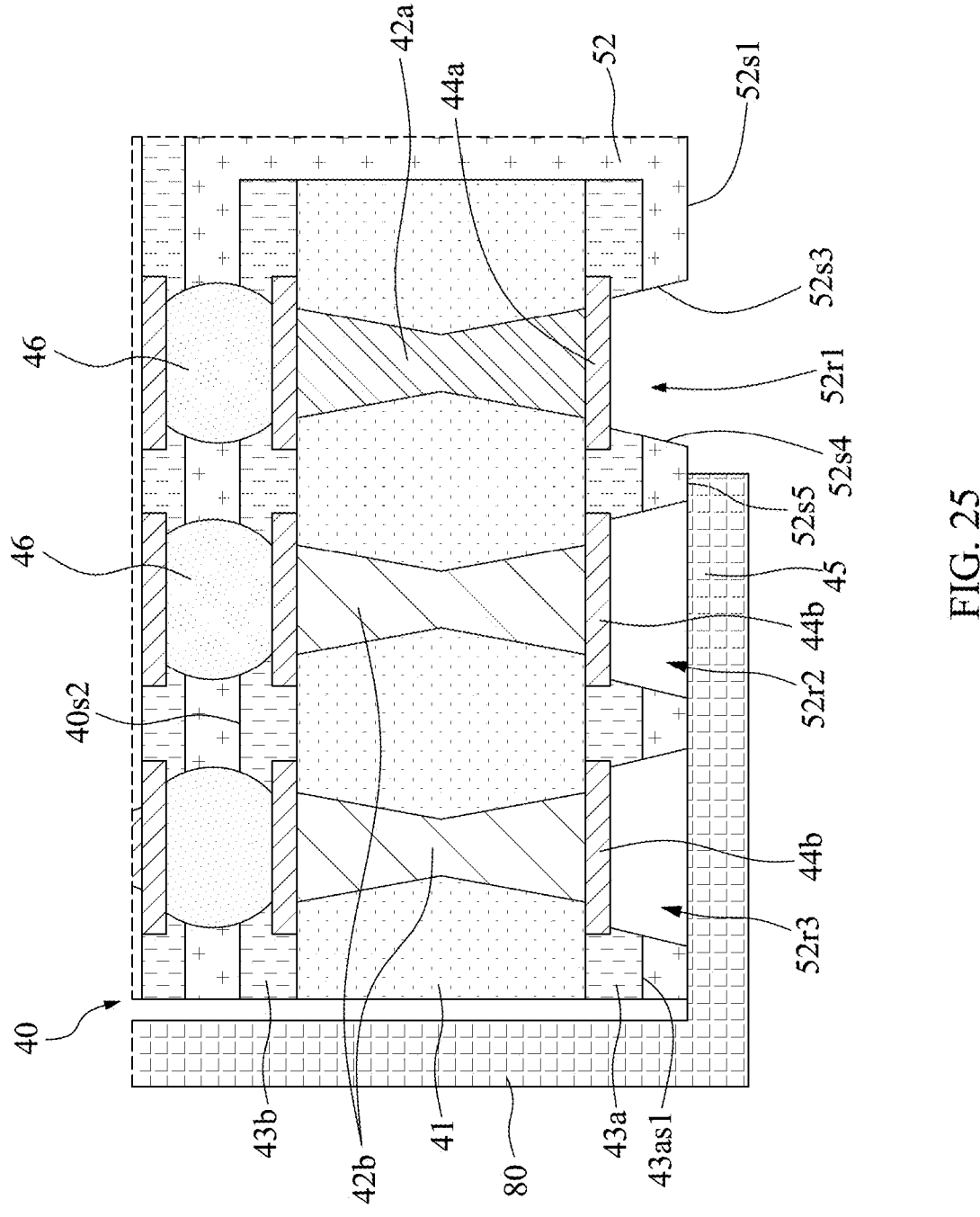
FIG. 25 illustrates one or more stages of an example of a method for manufacturing an electronic device according to some embodiments of the present disclosure.
Figure 26:
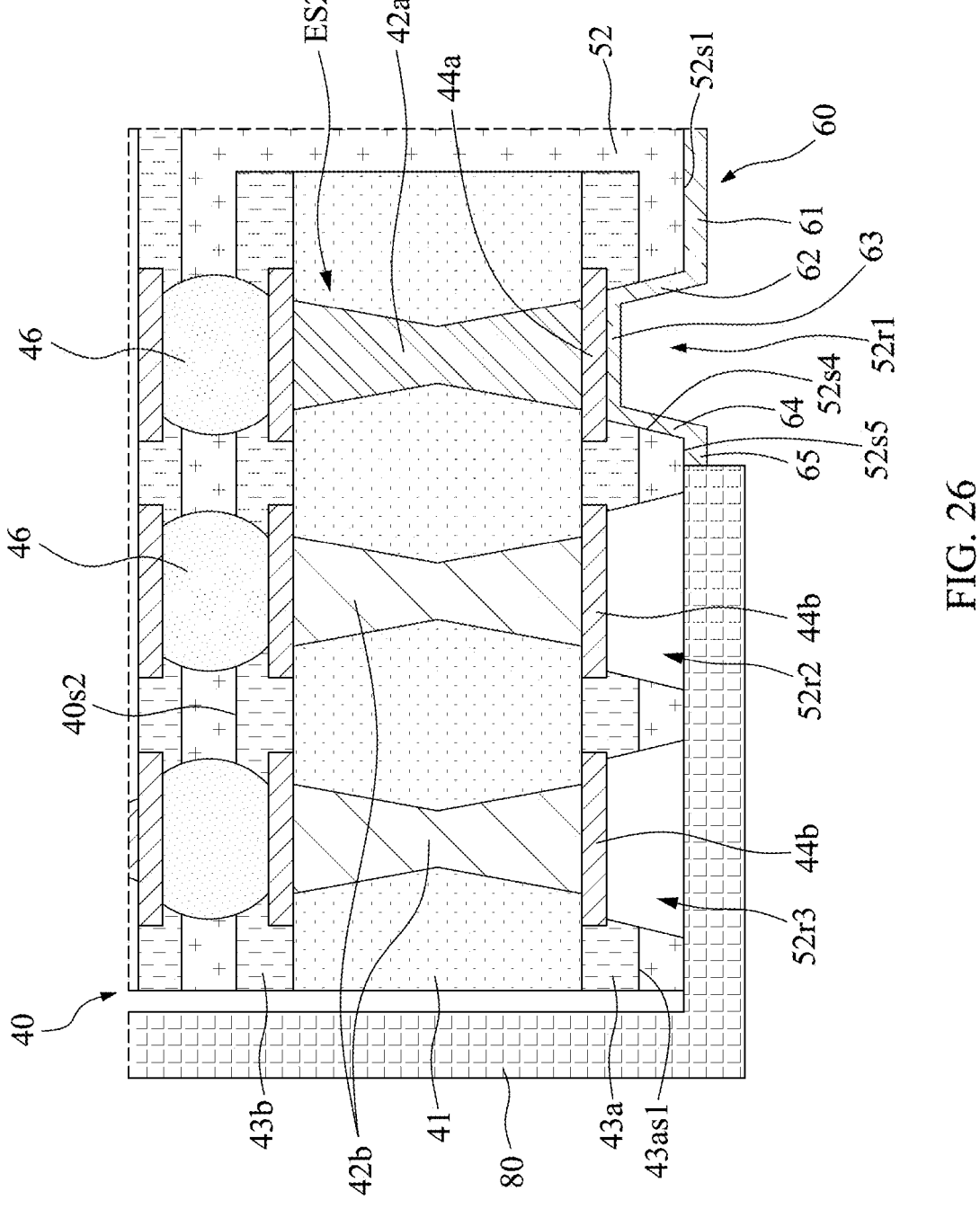
FIG. 26 illustrates one or more stages of an example of a method for manufacturing an electronic device according to some embodiments of the present disclosure.

FIG. 25 and FIG. 26 illustrate one or more stages of an example of a method for manufacturing an electronic device according to some embodiments of the present disclosure. The initial stage of the illustrated process is the same as, or similar to, the stage illustrated in FIG. 16B through FIG. 21. FIG. 25 depicts a stage subsequent to that depicted in FIG. 21.

Referring to FIG. 25, a mask 80 may be provided to cover a portion of the surface 52$s$1 of the encapsulant 52. Further, the recess 52$r$2 and recess 52$r$3 may be covered by the mask 80. The portion of the surface 52$s$1 located between the recesses 52$r$1 and 52$r$2 may be partially exposed by the mask 80. The recess 52$r$1 may be exposed by the mask 80.

Referring to FIG. 26, the EMI shielding layer 60 may be formed. The EMI shielding layer 60 may be formed on the portion of the encapsulant 52 not covered by the mask 80. As a result, the portions 64 and 65 may be formed. After the EMI shielding layer 60 is formed, the mask 80 may be removed, and the manufacturing processes as shown in FIG. 23 and FIG. 24 may be performed to form an electronic device (e.g., the electronic device 1$b$ as shown in FIG. 6A).

In some embodiments, an electronic device includes an electronic component, an interposer, and an electromagnetic interference (EMI) shielding layer. The interposer is adjacent to the electronic component and includes a first conductive element and a second conductive element. The EMI shielding layer covers the electronic component and is electrically connected to the second conductive element.

In some embodiments, the second conductive element is disposed on opposite two sides of the electronic component.

In some embodiments, the second conductive element surrounds the electronic component In some embodiments, the first conductive element includes a first group of conductive vias, the second conductive element includes a second group of conductive vias, and a density of the first group of conductive vias is less than a density of the second group of conductive vias.

In some embodiments, a plurality of electrical contacts are electrically connected to the first group of conductive vias and electrically isolated from the second group of conductive vias In some embodiments, an encapsulant covers the electronic component and the interposer. The encapsulant defines a first recess exposing the second conductive element, and the EMI shielding layer extends into the first recess.

In some embodiments, the encapsulant has a lateral surface defining the first recess, and the EMI shielding layer is disposed on two opposite sides of the lateral surface of the recess in a cross-sectional view In some embodiments, the encapsulant defines a second recess exposing the first conductive element and accommodating an electrical contact.

In some embodiments, the encapsulant defines a second recess exposing the first conductive element, and the EMI shielding layer covers a portion of the encapsulant located between the first conductive element and the second conductive element In some embodiments, the EMI shielding layer has a first portion on a bottom surface of the encapsulant and a second portion on a lateral surface of the encapsulant, and a thickness of the first portion is greater than a thickness of the second portion In some embodiments, the EMI shielding layer covers a bottom surface of the encapsulant located between the first conductive element and the second conductive element In some embodiments, the second conductive element is free of a solder joint at a side abutting the EMI shielding layer.

In some embodiments, a compartment structure penetrates the encapsulating and is electrically connected to the EMI shielding layer In some embodiments, an encapsulant encapsulates the electronic component. The interposer has an inner lateral surface facing the electronic component and an outer lateral surface opposite to the inner surface, and the outer lateral surface is exposed by the encapsulant.

In some embodiments, an electronic device includes an electronic component, an interposer, and an electromagnetic interference (EMI) shielding layer. The interposer is adjacent to the electronic component and includes a first conductive element and a second conductive element. The EMI shielding layer covers the electronic component and is electrically connected to the second conductive element.

In some embodiments, the EMI shielding structure includes a connecting portion connecting the vertical portion and the horizontal portion, and the connecting portion is slanted with respect to the vertical portion and the horizontal portion.

In some embodiments, a thickness of the connecting portion is less than a thickness of the horizontal portion.

In some embodiments, a composition of the horizontal portion is different from a composition of the vertical portion.

In some embodiments, a signal delivery structure is spaced apart from the electronic component by the vertical portion of the EMI shielding structure.

In some embodiments, the signal delivery structure includes conductive vias surrounding the vertical portion of the EMI shielding structure.

In some embodiments, an electronic device includes an electronic component, an interposer, and an electromagnetic interference (EMI) shielding layer. The interposer is adjacent to the electronic component and includes a first conductive element and a second conductive element. The EMI shielding layer covers the electronic component and is electrically connected to the second conductive element.

In some embodiments, an encapsulant encapsulates the first electronic component and is spaced apart from the second conductive element by a dielectric structure of the interposer.

In some embodiments, a grounding layer is spaced disposed on a lower surface of the encapsulant and electrically connected to the second conductive element.

In some embodiments, the grounding layer vertically overlaps the second conductive element.

In some embodiments, the grounding layer is free from vertically overlapping the first conductive element.

In some embodiments, a second electronic component is disposed adjacent to the first electronic component. A compartment structure is disposed between the first electronic component and the second electronic component. The compartment structure is connected to the grounding layer.

In some embodiments, the encapsulant has a first lateral surface connected to the lower surface and defining a first recess exposing the second conductive element, and the grounding layer completely covers the first lateral surface of the encapsulant.

In some embodiments, the encapsulant has a second lateral surface connected to the lower surface and defining a second recess exposing the first conductive element, and the grounding layer is spaced apart from the second lateral surface of the encapsulant.

In some embodiments, a portion of the grounding layer extends from the first lateral surface toward the second lateral surface.

In some embodiments, the grounding layer has an uneven thickness.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to =0.1%, or less than or equal to =0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the term "a distance between A and B" may refer to a length from an edge of the A to an edge of the B or to a length from a center of the A to a center of the B.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
a substrate;
an electronic component disposed under the substrate;
a circuit structure disposed under the substrate; and a shielding layer disposed under the substrate and covering the electronic component and connected to the circuit structure, wherein the circuit structure and the shielding layer are collectively configured to shield the electronic component from electromagnetic interference,
wherein the circuit structure comprises a first element and a second element disposed between the first element and the electronic component, and wherein the second element is connected to the shielding layer, and the second element comprises a plurality of conductive vias spaced apart from each other.

2. The electronic device of claim 1, wherein the first element and the second element are configured to transmit different electrical signals, and the second element is a grounding element.

3. The electronic device of claim 1, wherein the electronic component has four sides, and the second element is disposed adjacent to at least two sides of the electronic component.

4. The electronic device of claim 1, further comprising:
an encapsulant encapsulating the electronic component and the circuit structure, and the circuit structure comprises a first terminal connected to the shielding layer and exposed by the encapsulant.

5. The electronic device of claim 4, wherein the encapsulant defines a first recess exposing the first terminal.

6. The electronic device of claim 5, wherein the first recess is recessed from a first lower surface of the encapsulant.

7. The electronic device of claim 5, wherein the shielding layer comprises a first portion disposed on a first lateral surface of the first recess in a cross-sectional view.

8. The electronic device of claim 7, wherein the shielding layer comprises a second portion disposed on a second lateral surface, opposite to the first lateral surface, of the first recess in the cross-sectional view.

9. The electronic device of claim 7, wherein the shielding layer comprises a second portion disposed on a second lower surface of the encapsulant and spaced apart from the first portion in the cross-sectional view.

10. The electronic device of claim 7, wherein the shielding layer comprises a second portion disposed on a first lower surface of the encapsulant, wherein a thickness of the second portion is greater than a thickness of the first portion.

11. The electronic device of claim 5, further comprising:
an electrical connector,
wherein the encapsulant defines a second recess exposing a second terminal of the circuit structure, and the electrical connector is at least partially disposed within the second recess and spaced apart from the shielding layer.

12. An electronic device, comprising:
a substrate;
an electronic component disposed under the substrate;
a circuit structure disposed under the substrate;
a shielding layer disposed under the substrate and covering the electronic component and connected to the circuit structure, wherein the circuit structure and the shielding layer are collectively configured to shield the electronic component from electromagnetic interference;
a plurality of first soldering elements disposed on an upper surface of the circuit structure; and
a plurality of second soldering elements disposed on a lower surface of the circuit structure, wherein a quantity of the plurality of first soldering elements is different from a quantity of the plurality of second soldering elements in a cross-sectional view.

13. An electronic device, comprising:

an electronic component;

a circuit structure adjacent to the electronic component and comprising a conductive pad;

an encapsulant encapsulating the electronic component, wherein the encapsulant and the circuit structure collectively define a step; and an shielding layer covering the electronic component, wherein a portion of the shielding layer is disposed on the step and connected to the conductive pad, wherein the step exposes a dielectric layer of the circuit structure, and the portion of the shielding layer contacts the dielectric layer.

14. The electronic device of claim 13, wherein the step exposes a portion of the conductive pad of the circuit structure, and the portion of the shielding layer is conformal to the conductive pad.

\* \* \* \* \*